United States Patent
Han et al.

(10) Patent No.: US 9,514,830 B2
(45) Date of Patent: Dec. 6, 2016

(54) NON-VOLATILE MEMORY DEVICE, MEMORY SYSTEM INCLUDING THE SAME, AND METHOD OF OPERATING THE SAME

(71) Applicants: Sang Hwa Han, Suwon-Si (KR); Hee Woong Kang, Suwon-Si (KR)

(72) Inventors: Sang Hwa Han, Suwon-Si (KR); Hee Woong Kang, Suwon-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/072,383

(22) Filed: Mar. 17, 2016

(65) Prior Publication Data

US 2016/0276040 A1    Sep. 22, 2016

(30) Foreign Application Priority Data

Mar. 19, 2015    (KR) .......................... 10-2015-0038419

(51) Int. Cl.
*G11C 11/34* (2006.01)
*G11C 16/28* (2006.01)

(52) U.S. Cl.
CPC ..................... *G11C 16/28* (2013.01)

(58) Field of Classification Search
CPC ................. G11C 16/28; G11C 11/5642; G11C 2211/5634
USPC ................................. 365/185.2, 189.07, 236
See application file for complete search history.

(56) References Cited

U.S. PATENT DOCUMENTS

| | | |
|---|---|---|
| 7,257,025 B2 | 8/2007 | Maayan et al. |
| 7,869,281 B2 | 1/2011 | Nazarian |
| 7,876,621 B2 | 1/2011 | Sharon et al. |
| 8,000,135 B1 | 8/2011 | Perlmutter et al. |
| 8,154,921 B2 | 4/2012 | Mokhlesi et al. |
| 8,355,285 B2 | 1/2013 | Huang et al. |
| 8,631,288 B2 | 1/2014 | Helm et al. |
| 8,756,621 B2 * | 6/2014 | Lee .................. H04N 21/64322 725/10 |
| 8,811,076 B2 | 8/2014 | Venkitachalam et al. |
| 2009/0310404 A1* | 12/2009 | Cho ......................... G11C 7/06 365/185.2 |
| 2013/0148436 A1 | 6/2013 | Kurosawa |
| 2014/0126285 A1 | 5/2014 | Kang |
| 2014/0129903 A1 | 5/2014 | Yoon et al. |
| 2014/0153330 A1 | 6/2014 | Yoon et al. |
| 2014/0198569 A1 | 7/2014 | Kim et al. |

* cited by examiner

*Primary Examiner* — Son Dinh
(74) *Attorney, Agent, or Firm* — Volentine & Whitt, PLLC

(57) ABSTRACT

A method of operating a non-volatile memory device includes setting a search region defined by a start read voltage and an end read voltage, determining whether the search region belongs to a reference region, changing the search region when it is determined that the search region does not belong to the reference region, and searching for a new read voltage based on the search region, when it is determined that the search region belongs to the reference region.

20 Claims, 28 Drawing Sheets

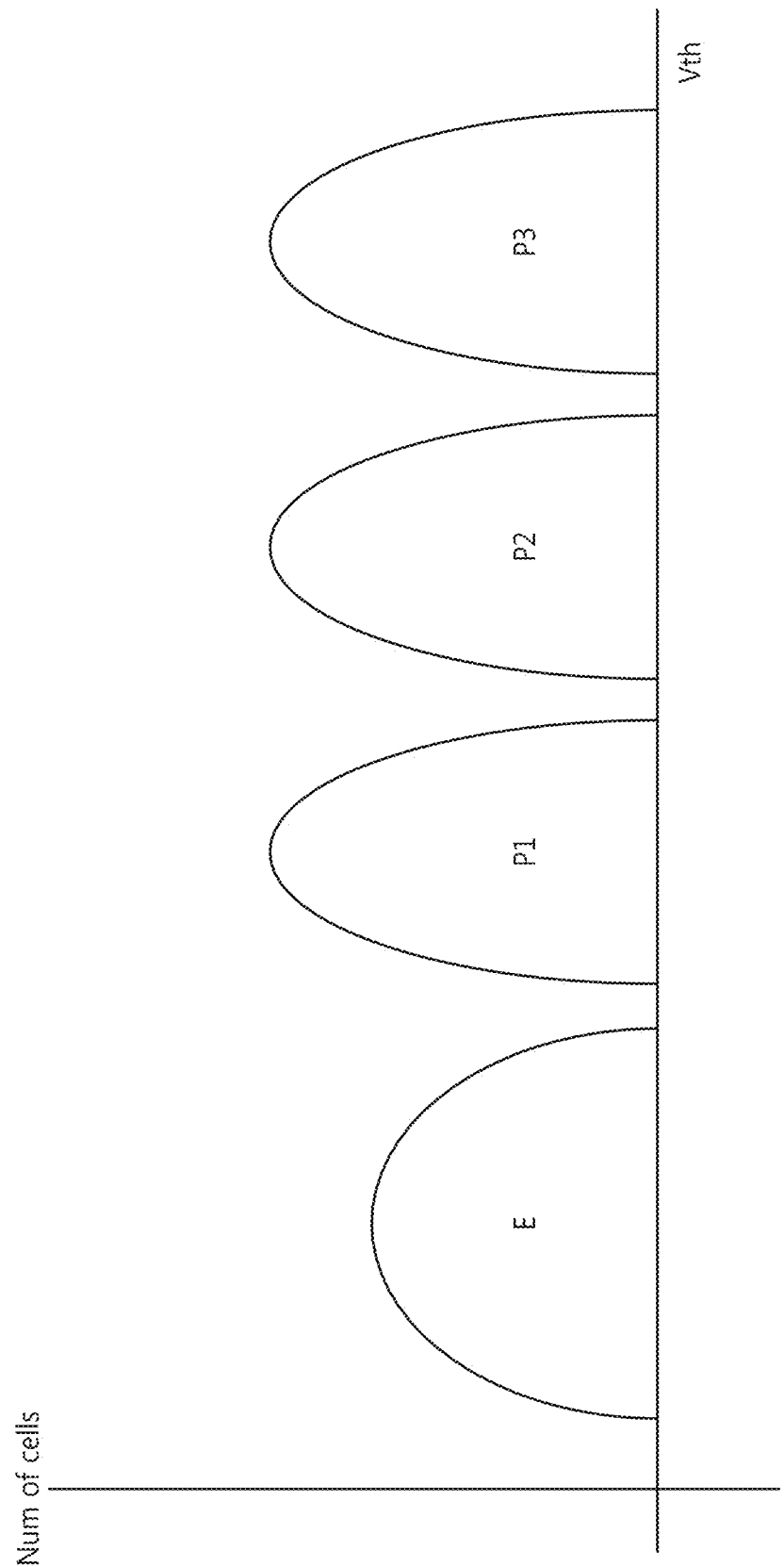

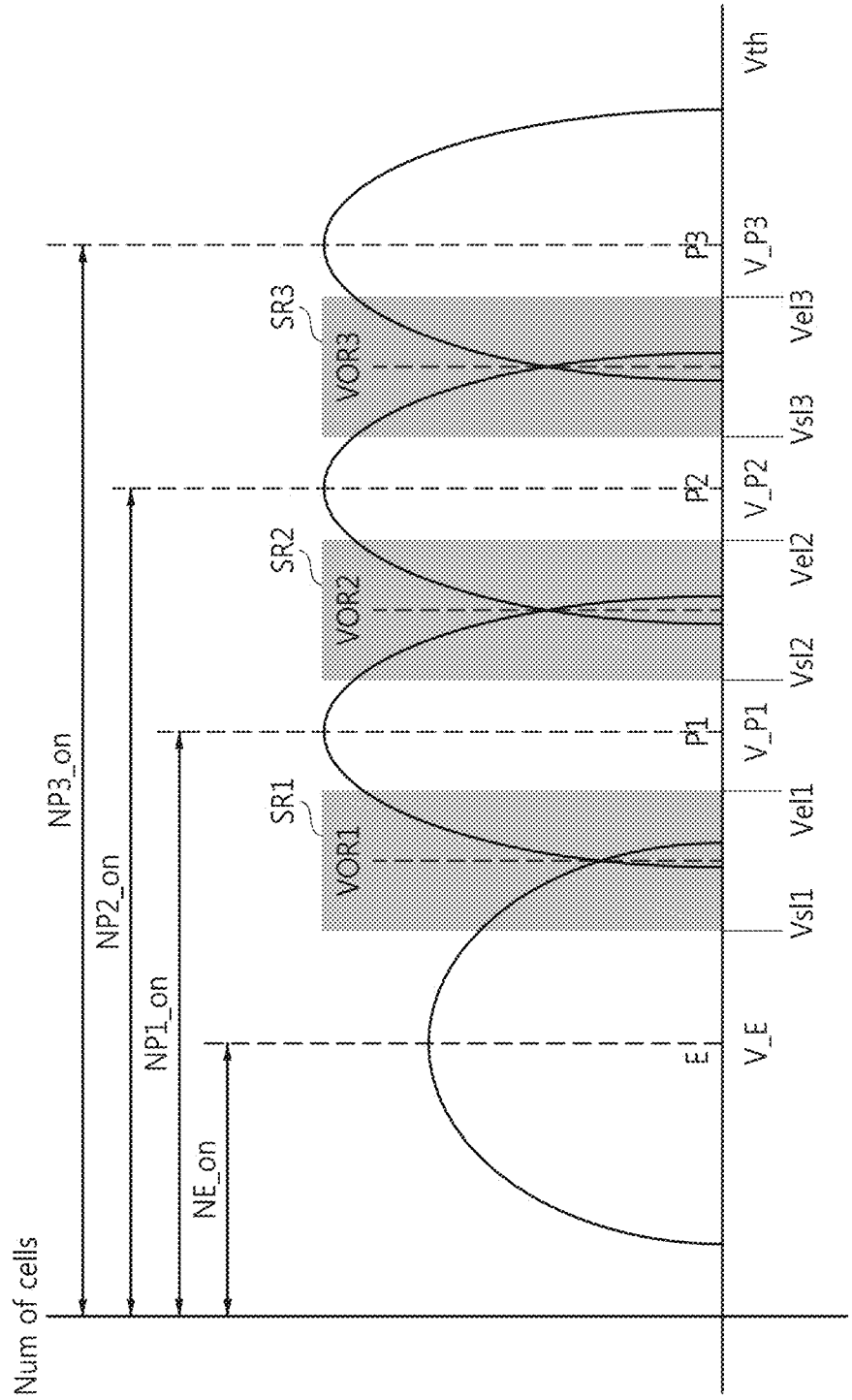

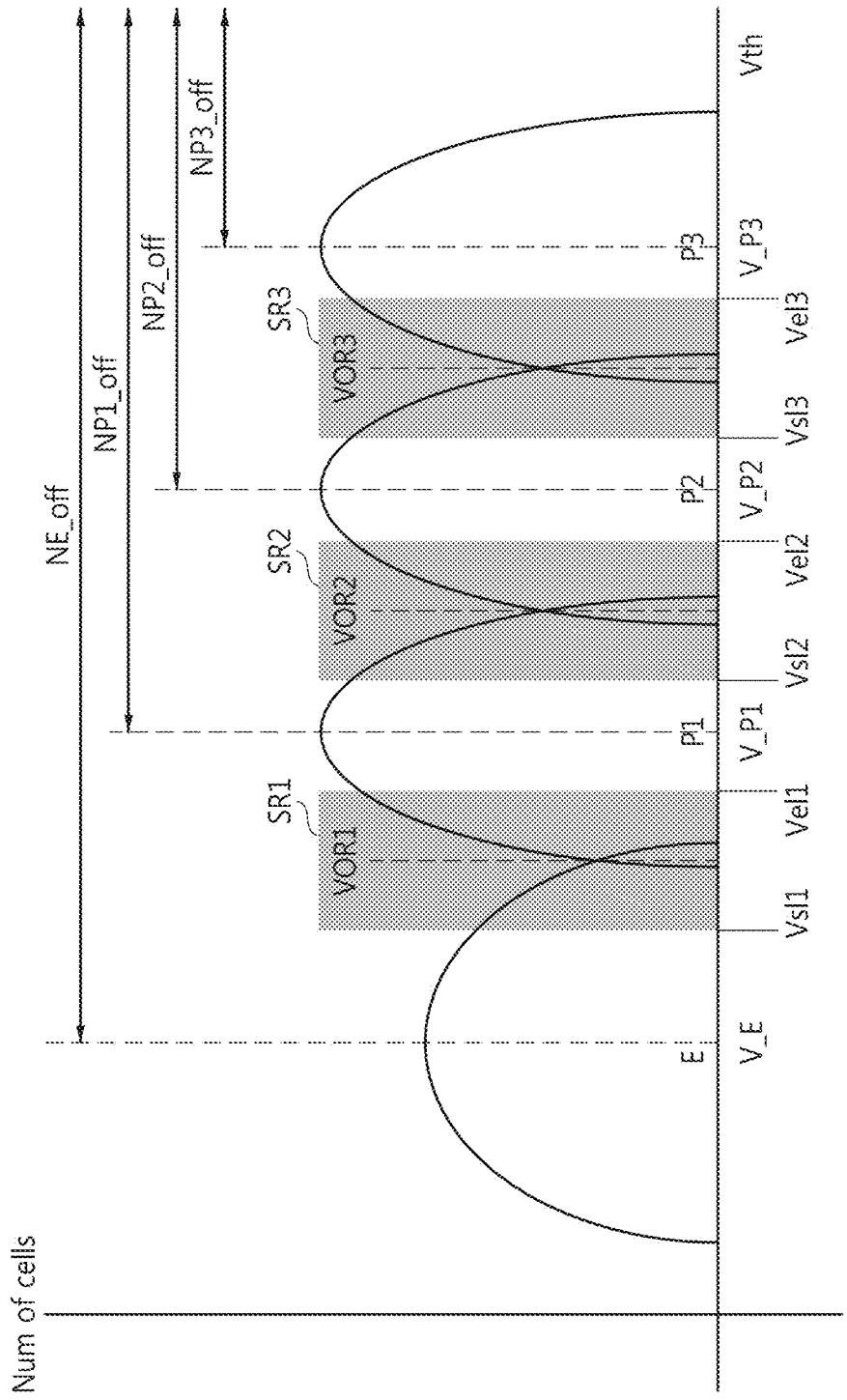

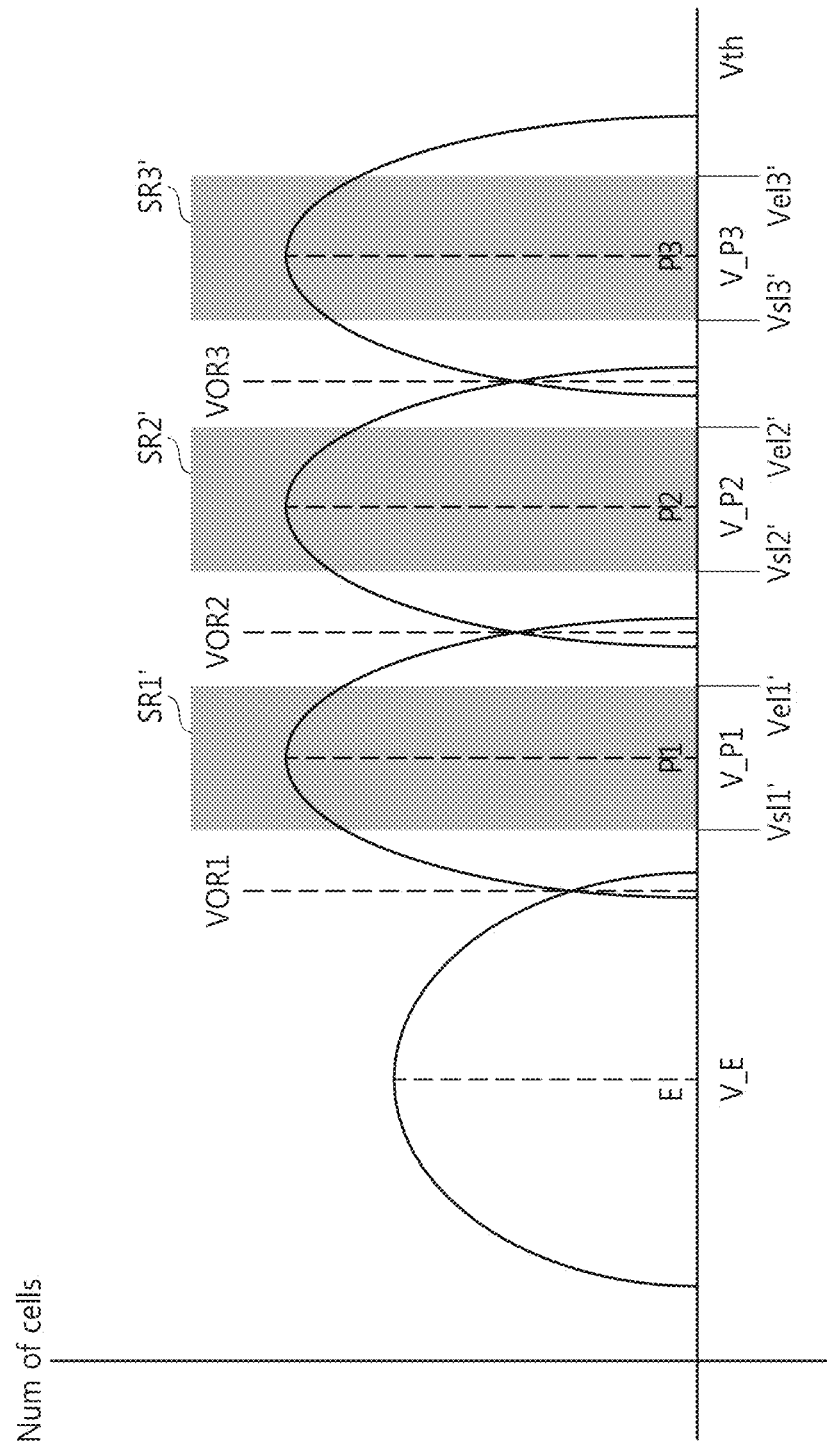

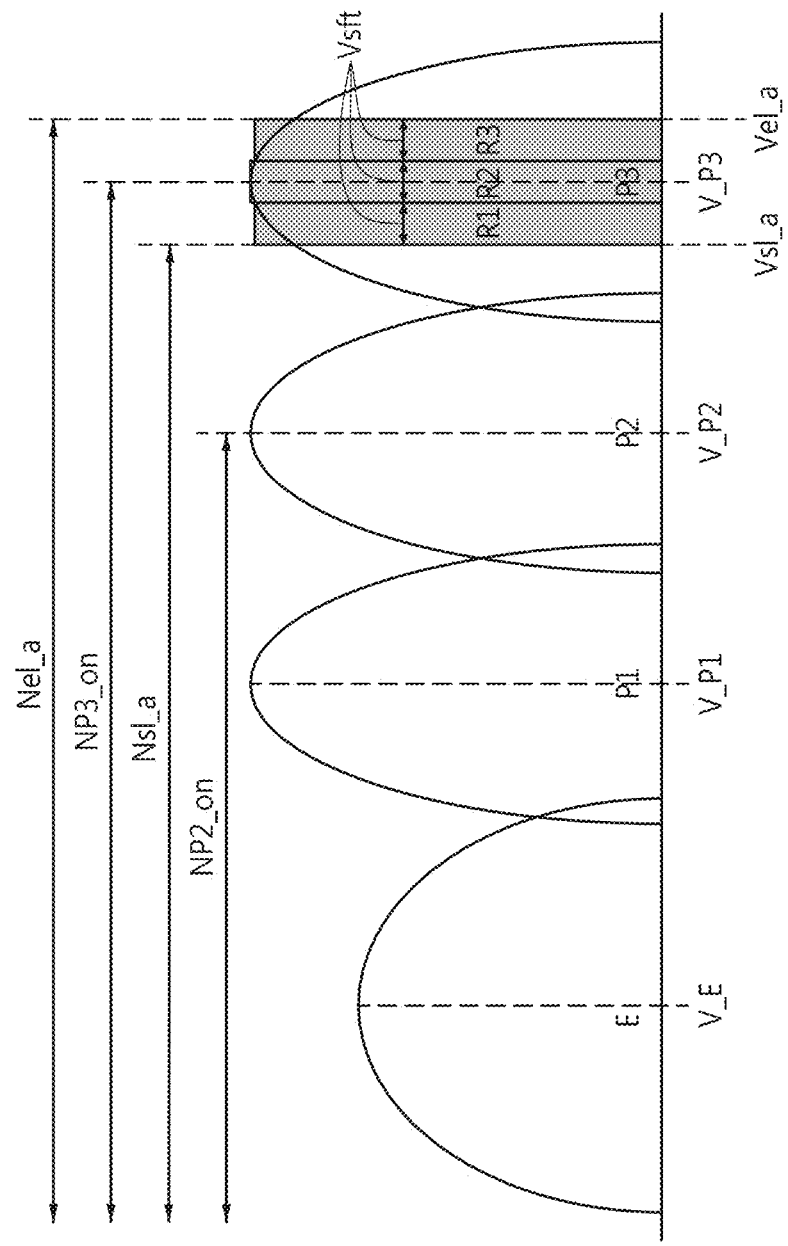

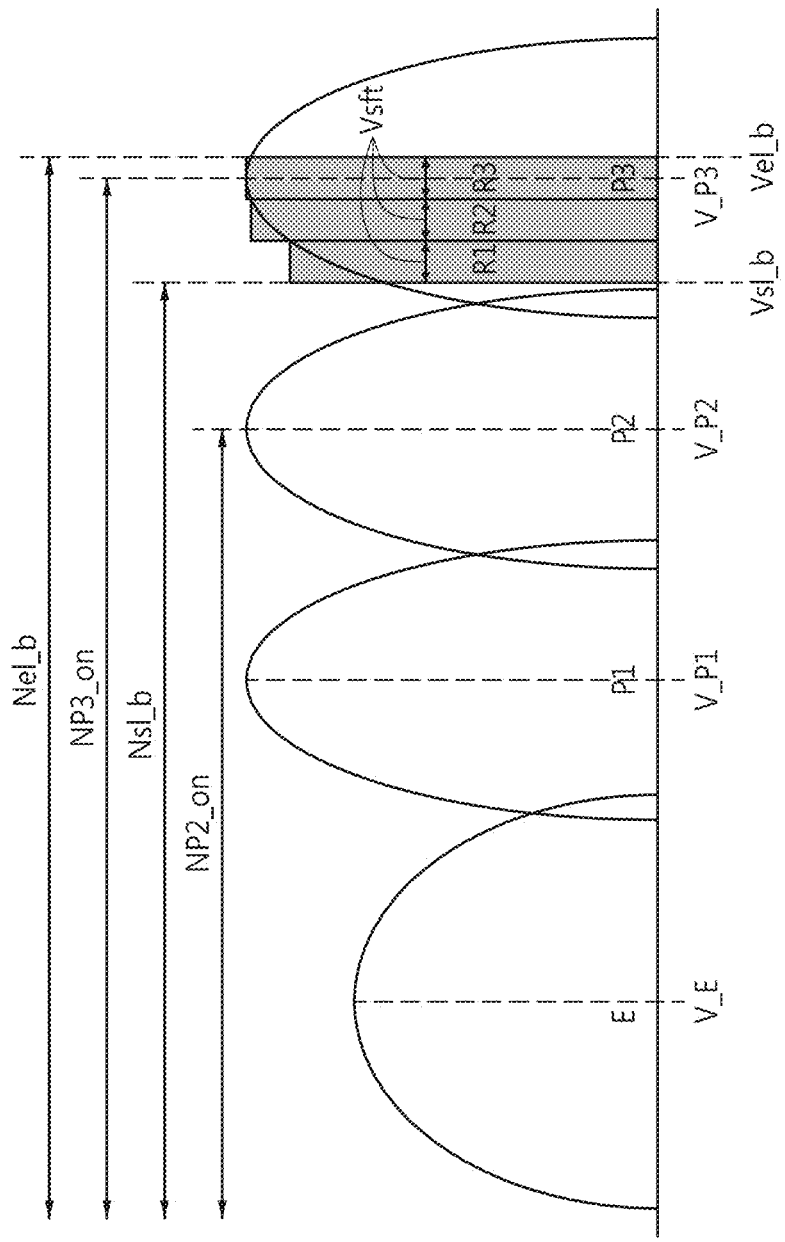

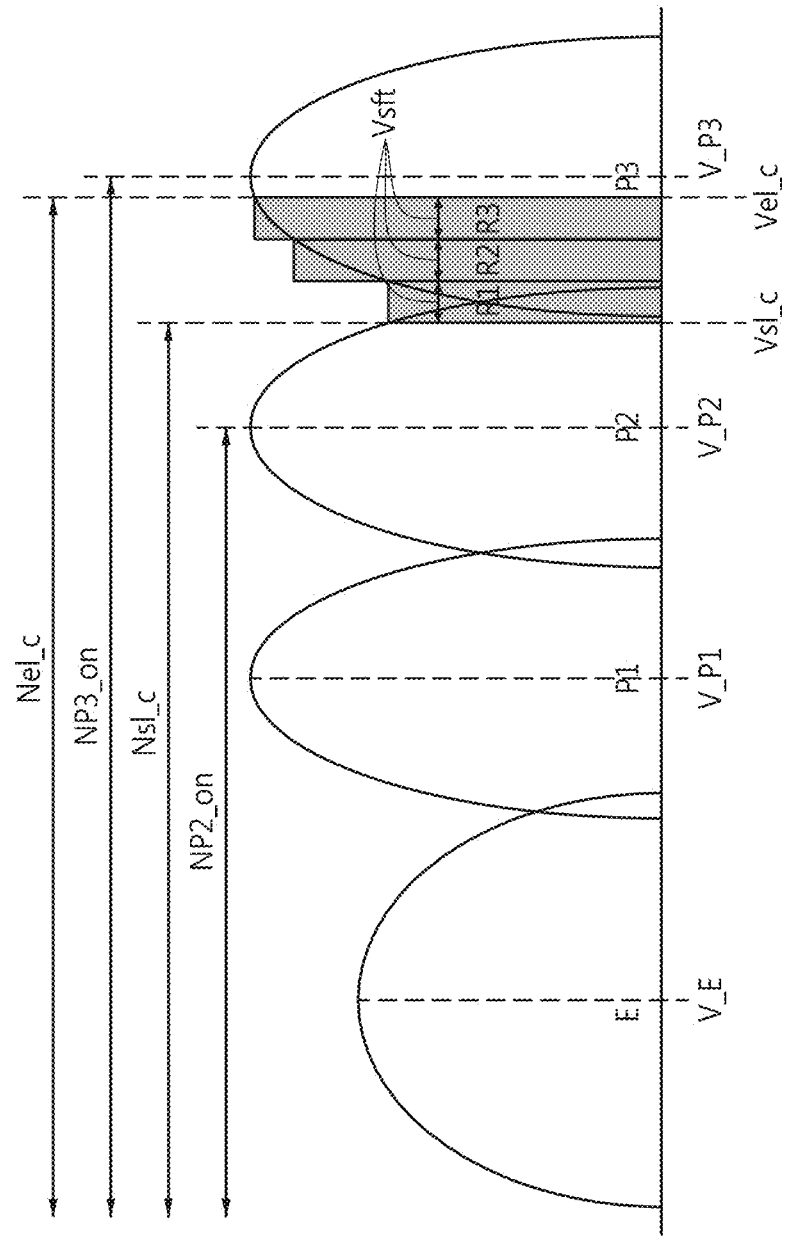

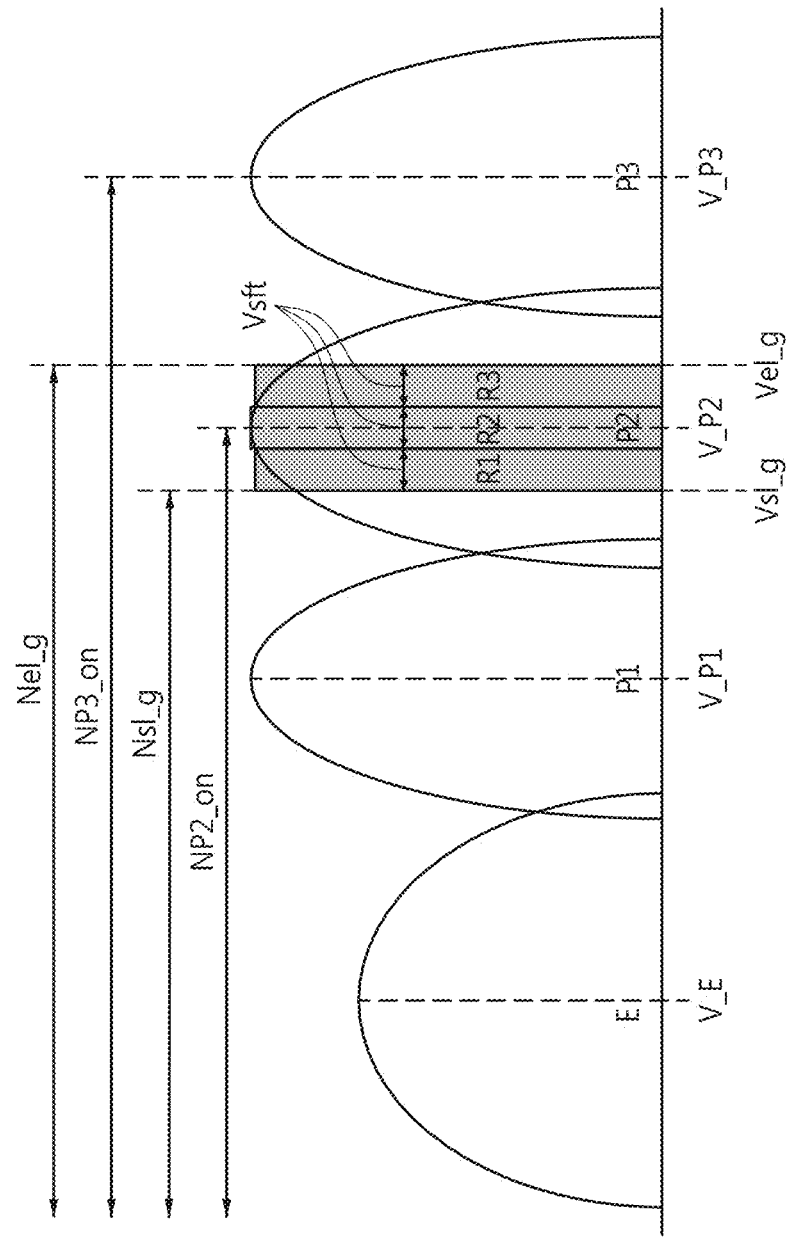

NON-VOLATILE MEMORY DEVICE, MEMORY SYSTEM INCLUDING THE SAME, AND METHOD OF OPERATING THE SAME

CROSS-REFERENCE TO RELATED APPLICATIONS

This application claims priority under 35 U.S.C. §119(a) from Korean Patent Application No. 10-2015-0038419 filed on Mar. 19, 2015, the disclosure of which is hereby incorporated by reference in its entirety.

BACKGROUND

Exemplary embodiments of the disclosure relate to a semiconductor memory device and a memory system including the same, and more particularly, to a non-volatile memory device and a memory system including the same.

Semiconductor memory devices may be categorized as volatile semiconductor memory devices and non-volatile semiconductor memory devices. A flash memory device is representative of volatile semiconductor memory devices.

Non-volatile memory devices are usually used as data storage media for electronic devices such as a computer, a cellular phone, a digital camera, a camcorder, a voice recorder, an MP3 player, a personal digital assistant (PDA), and a game console. With the miniaturization of manufacturing processes of a non-volatile memory device (e.g., a flash memory device), it is increasingly difficult to reliably read data due to the shift of a threshold voltage distribution over time. Therefore, increasing data integrity is getting crucial.

SUMMARY

According to an exemplary embodiment of the disclosure, there is provided a method of operating a non-volatile memory device. The method includes setting a search region defined by a start read voltage and an end read voltage, determining whether the search region belongs to a reference region, changing the search region when it is determined that the search region does not belong to the reference region, and searching for a new read voltage based on the search region when it is determined that the search region belongs to the reference region.

The determining whether the search region belongs to the reference region may include counting a number of first memory cells having a threshold voltage lower than the start read voltage and comparing the number of first memory cells with a number of first reference memory cells; and counting a number of second memory cells having a threshold voltage lower than the end read voltage and comparing the number of second memory cells with a number of second reference memory cells.

The changing the search region may include increasing the start read voltage and the end read voltage by a first shift voltage when the number of first memory cells is not greater than the number of first reference memory cells and decreasing the start read voltage and the end read voltage by a second shift voltage when the number of second memory cells is greater than the number of second reference memory cells.

The number of first reference memory cells may be a number of memory cells having a threshold voltage lower than a first reference threshold voltage. The number of second reference memory cells may be a number of memory cells having a threshold voltage lower than a second reference threshold voltage. The first and second reference threshold voltages may be threshold voltages that have maximum numbers of memory cells in adjacent threshold voltage distributions, respectively.

Alternatively, the determining whether the search region belongs to the reference region may include counting a number of first memory cells having a threshold voltage higher than the start read voltage and comparing the number of first memory cells with a number of first reference memory cells; and counting a number of second memory cells having a threshold voltage higher than the end read voltage and comparing the number of second memory cells with a number of second reference memory cells.

The changing the search region may include increasing the start read voltage and the end read voltage by a first shift voltage when the number of first memory cells is greater than the number of first reference memory cells and decreasing the start read voltage and the end read voltage by a second shift voltage when the number of second memory cells is not greater than the number of second reference memory cells.

The number of first reference memory cells may be a number of memory cells having a threshold voltage higher than a first reference threshold voltage. The number of second reference memory cells may be a number of memory cells having a threshold voltage higher than a second reference threshold voltage. The first and second reference threshold voltages may be threshold voltages that have maximum numbers of memory cells in adjacent threshold voltage distributions, respectively.

The number of first memory cells and the number of second reference memory cells may be calculated in advance and stored in a register.

According to an exemplary embodiment of the disclosure, there is provided a method of operating a non-volatile memory device. The method includes comparing a first start read voltage with a first reference threshold voltage, comparing a first end read voltage with a second reference threshold voltage, changing the first start read voltage and the first end read voltage based on both comparison results to generate a second start read voltage and a second end read voltage, and searching for a new read voltage based on the second start read voltage and the second end read voltage that have been changed.

The changing the first start read voltage and the first end read voltage may include increasing the first start read voltage and the first end read voltage by a first shift voltage when the first start read voltage is not greater than the first reference threshold voltage and decreasing the first start read voltage and the first end read voltage by a second shift voltage when the first end read voltage is greater than the second reference threshold voltage.

The comparing the first start read voltage with the first reference threshold voltage may include counting a number of first memory cells having a threshold voltage lower than the first start read voltage and comparing the number of first memory cells with a number of first reference memory cells. The number of first reference memory cells may be a number of memory cells having a threshold voltage lower than the first reference threshold voltage and may be calculated without actual counting.

The comparing the first end read voltage with the second reference threshold voltage may include counting a number of second memory cells having a threshold voltage lower than the first end read voltage and comparing the number of second memory cells with a number of second reference memory cells. The number of second reference memory cells may be a number of memory cells having a threshold voltage lower than the second reference threshold voltage and may be calculated without actual counting.

Alternatively, the comparing the first start read voltage with the first reference threshold voltage may include counting a number of first memory cells having a threshold voltage higher than the first start read voltage and comparing the number of first memory cells with a number of first reference memory cells. The number of first reference memory cells may be a number of memory cells having a threshold voltage higher than the first reference threshold voltage and may be calculated without actual counting.

The comparing the first end read voltage with the second reference threshold voltage may include counting a number of second memory cells having a threshold voltage higher than the first end read voltage and comparing the number of second memory cells with a number of second reference memory cells. The number of second reference memory cells may be a number of memory cells having a threshold voltage higher than the second reference threshold voltage and may be calculated without actual counting.

The first shift voltage may change according to a difference between the number of first memory cells and the number of first reference memory cells.

The searching for the new read voltage may include dividing a region between the second start read voltage and the second end read voltage into first through third ranges and counting a number of memory cells in each of the first through third ranges; and comparing the number of memory cells in the second range with the number of memory cells in the first range and the number of memory cells in the third range to find out whether the number of memory cells in the second range is equal to or less than the numbers of memory cells in the first and third ranges.

According to another exemplary embodiment of the disclosure, there is provided a memory system including a non-volatile memory device configured to read data from selected memory cells in response to a read command including read voltage information; and a memory controller configured to determine whether a search region defined by a start read voltage and an end read voltage belongs to a reference region based on the data, to change the search region when it is determined that the search region does not belong to the reference region, and to determine a new read voltage using the search region when it is determined that the search region belongs to the reference region.

The read voltage information may include the start read voltage and the end read voltage.

According to another exemplary embodiment of the disclosure, there is provided a method, executed by a memory controller, of operating a nonvolatile memory device comprising memory cells. The method includes identifying a first range of voltages within a reference region defined by a second range of voltages between a first threshold read voltage that identifies a maximum number of the memory cells in a first program/erase state and a second threshold read voltage that identifies a maximum number of the memory cells in an adjacent second program state. The first range of voltages is divided into multiple ranges. For each of the multiple ranges, the number of memory cells having threshold read voltages between the minimum and maximum voltages of the range is identified. The one of the multiple ranges having the least number of identified memory cells is identified. A voltage between the minimum and maximum voltages of the identified range is selected, and the selected voltage is applied as a read voltage in a read operation of the memory cells.

The selected voltage may be applied to write lines of the memory cells in the read operation.

The multiple ranges may be three ranges.

Identifying the first range of voltages may include: a) establishing a search region defined by a start read voltage and an end read voltage; b) determining whether the start read voltage and the end read voltage are within the second range of voltages defined by the reference region; and c) incrementing or decrementing both the start read voltage and the end read voltage by a predetermined value so as to bring at least one of the start read voltage and the end read voltage closer to the second range of voltages defined by the reference region, when at least one of the start read voltage and the end read voltage is not within the second range of voltages defined by the reference region.

Operations (b) and (c) may be repeated until both the start read voltage and the end read voltage are determined to be within the second range of voltages defined by the reference region.

BRIEF DESCRIPTION OF THE DRAWINGS

The above and other features of the present disclosure will become more apparent by describing in detail exemplary embodiments thereof with reference to the accompanying drawings in which:

FIG. 7 is a diagram of threshold voltage distributions in an initial erased state and a programmed state of a non-volatile memory device according to an exemplary embodiment of the disclosure.

FIGS. 8A through 8C are diagrams for explaining a search region and a reference region according to an exemplary embodiment of the disclosure.

FIG. 9 is a diagram for explaining a search region and a reference region according to an exemplary embodiment of the disclosure.

FIGS. 15A through 15D are diagrams for explaining the method illustrated in FIGS. 10 and 11 according to an exemplary embodiment of the disclosure.

FIGS. 16A through 16D are diagrams for explaining the method illustrated in FIGS. 10 and 11 according to an exemplary embodiment of the disclosure.

DETAILED DESCRIPTION OF THE EMBODIMENTS

Figure 1:
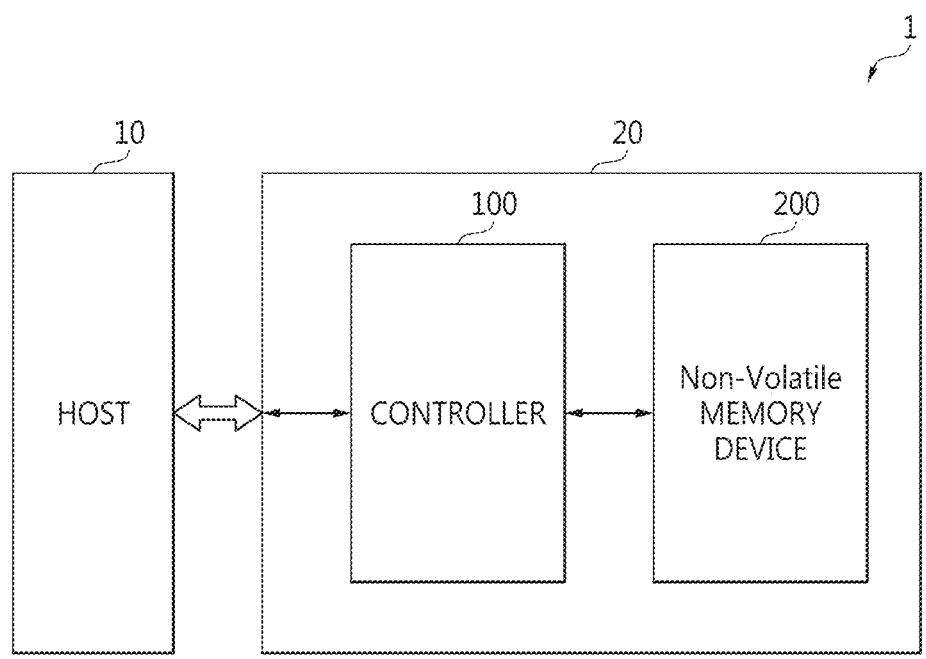
FIG. 1 is a schematic block diagram of an electronic system according to an exemplary embodiment of the disclosure.

The disclosure now will be described more fully hereinafter with reference to the accompanying drawings, in which embodiments of the disclosure are shown. This disclosure may, however, be embodied in many different forms and should not be construed as limited to the embodiments set forth herein. Rather, these embodiments are provided so that this disclosure will be thorough and complete, and will fully convey the scope of the disclosure to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 2:
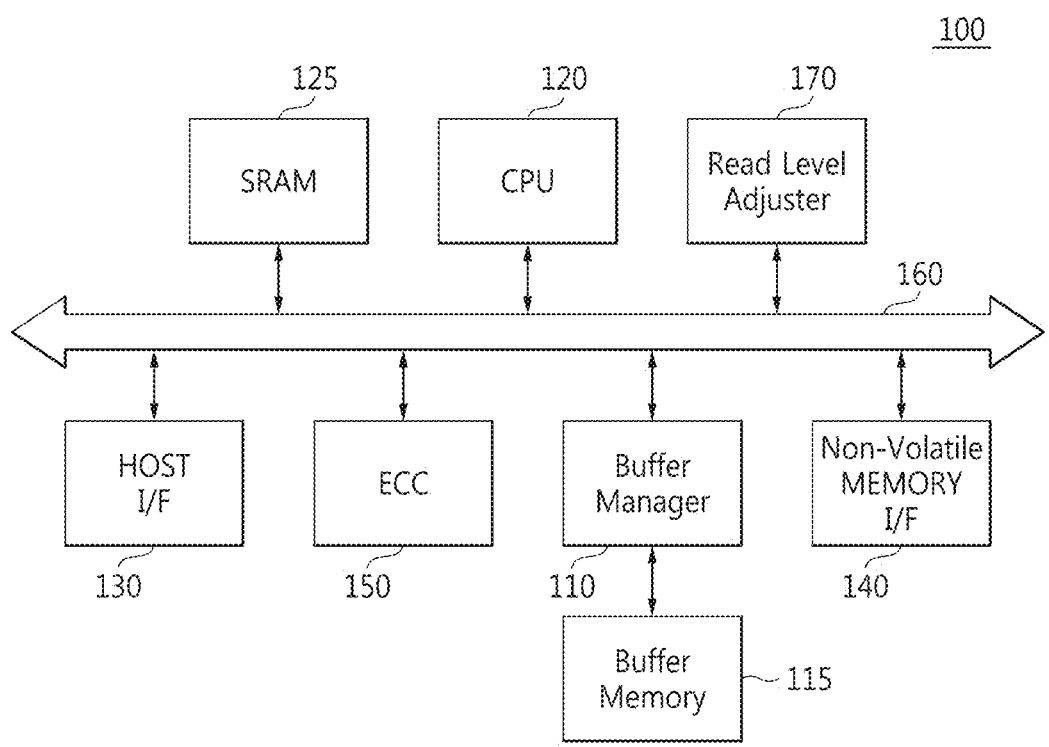
FIG. 2 is a block diagram of a controller illustrated in FIG. 1 according to an exemplary embodiment of the disclosure.

FIG. 1 is a schematic block diagram of an electronic system 1 according to an exemplary embodiment of the disclosure. FIG. 2 is a block diagram of a controller 100 illustrated in FIG. 1 according to an exemplary embodiment of the disclosure.

Referring to FIG. 1, the electronic system 1 includes a host 10 and a non-volatile memory system 20. The non-volatile memory system 20 connected with the host 10 includes the memory controller 100 and a non-volatile memory device 200.

The non-volatile memory system 20 may be a solid state drive (SSD), a multimedia card (MMC), an embedded MMC (eMMC), or a secure digital (SD) card, but the disclosure is not restricted to these examples. The non-volatile memory device 200 may be a flash memory device but is not restricted thereto. It may be a phase-change random access memory (PRAM) device, a magnetoresistive RAM (MRAM) device, a resistive RAM (ReRAM) device, or a ferroelectric RAM (FeRAM) device.

When the non-volatile memory device 200 is a flash memory device, it may be a NAND flash memory device using floating-gate technology or charge trap flash (CTF) technology. Memory cell transistors may be arranged in two or three dimensions in the non-volatile memory device 200, which will be described in detail later.

The controller 100 controls the overall operation of the non-volatile memory system 20 and controls the overall data exchange between the host 10 and the non-volatile memory device 200. For instance, the controller 100 controls the non-volatile memory device 200 to write or read data at the request of the host 10. The controller 100 also controls a series of internal operations (e.g., performance adjustment, merging, and wear leveling) needed for the features of or the efficient management of the non-volatile memory device 200.

The non-volatile memory device 200 is storage for storing data in a non-volatile manner. It may store an operating system (OS), a variety of programs, and diverse types of data.

Referring to FIG. 2, the controller 100 may include a buffer manager 110, a buffer memory 115, a central processing unit (CPU) 120, static RAM 125, a host interface (I/F) 130, a non-volatile memory I/F 140, an error correction code (ECC) block 150, a bus 160, and a read level adjuster 170. The buffer manager 110 manages the buffer memory 115. The buffer memory 115 may include volatile memory, such as SRAM or dynamic RAM (DRAM). The buffer memory 115 functions as a buffer that temporarily stores data to be stored in the non-volatile memory device 200 and data that has been read from the non-volatile memory device 200. The buffer memory 115 is included in the controller 100 in the current embodiment, but it may be implemented outside of or both outside and inside of the controller 100 in exemplary embodiments.

The host I/F 130 is equipped with an interface protocol to communicate with the host 10. The interface protocol may be ultra high speed (UHS) (i.e., UHS-I or UHS-II), peripheral component interconnect-express (PCI-E), advanced technology attachment (ATA), serial ATA (SATA), parallel ATA (PATA), or a serial attached SCSI (SAS). However, the interface protocol between the host 10 and the non-volatile memory system 20 is not restricted to the above examples and may be one of other interface protocols such as a universal serial bus (USB) protocol, an MMC protocol, an enhanced small disk interface (ESDI) protocol, and an integrated drive electronics (IDE) protocol.

The non-volatile memory I/F 140 may interface data between the non-volatile memory device 200 and the memory controller 100. The non-volatile memory I/F 140 may apply a command (or command sets) and an address to the non-volatile memory device 200 so that the non-volatile memory device 200 performs a program operation, a read operation, or an erase operation. For instance, the non-volatile memory I/F 140 may apply a read command to the non-volatile memory device 200 and may receive data that has been read from the non-volatile memory device 200 in response to the read command. The read command may include information about a read voltage.

The CPU 120 performs overall control to write data to and read data from the non-volatile memory device 200. The CPU 120 may control data exchange among the buffer memory 115, the host I/F 130, the ECC block 150, and the non-volatile memory I/F 140 through the bus 160. The CPU 120 may also run a flash translation layer (FTL) (not shown).

The SRAM 125 may store a program or code executed by the CPU 120. The FTL run by the CPU 120 may also be stored in the SRAM 125. In an exemplary embodiment, the FTL or the program executed by the CPU 120 may be stored in a particular area of the non-volatile memory device 200 and it may be loaded to the SRAM 125 at the startup of the non-volatile memory system 20.

The ECC block 150 encodes data to be stored in the non-volatile memory device 200 and decodes data read from the non-volatile memory device 200 to detect and correct errors in the data that has been read. The ECC block 150 may perform hard decision decoding using hard decision data read from the non-volatile memory device 200. The ECC block 150 may also perform soft decision decoding using soft decision data read from the non-volatile memory device 200. The ECC block 150 may include a decoder engine for performing hard decision decoding and a decoder engine for performing soft decision decoding in exemplary embodiments.

The read level adjuster 170 may set a search region for finding an optimal read voltage, may determine whether the search region belongs to a reference region, and may reset the search region. The read level adjuster 170 may also find the optimal read voltage based on the search region that has been set.

Figure 3:
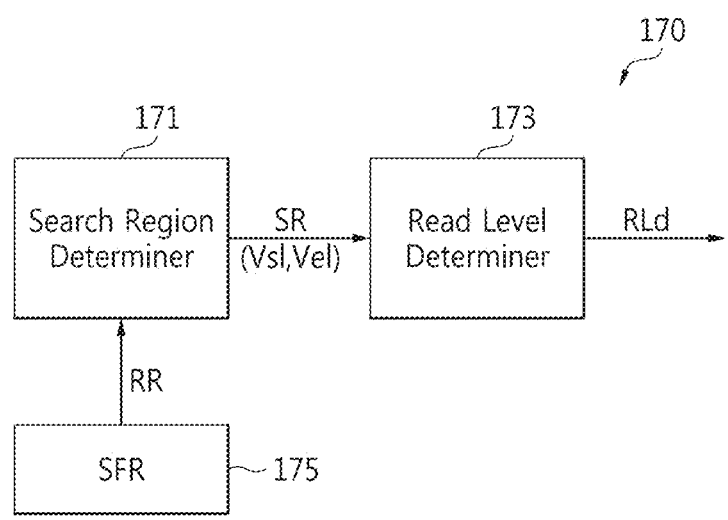
FIG. 3 is a block diagram of a read level adjuster illustrated in FIG. 2 according to an exemplary embodiment of the disclosure.

FIG. 3 is a block diagram of the read level adjuster 170 illustrated in FIG. 2 according to an exemplary embodiment of the disclosure. Referring to FIG. 3, the read level adjuster 170 may include a search region determiner 171 and a read level determiner 173.

The search region determiner 171 sets a search region SR defined by a start read voltage Vsl and an end read voltage Vel and determines whether the search region SR belongs to a reference region RR. When it is determined that the search region SR does not belong to the reference region RR, the search region determiner 171 modifies the search region SR. When it is determined that the search region SR belongs to the reference region RR, the search region determiner 171 provides information about the search region SR for the read level determiner 173. The search region SR and the reference region RR will be described with reference to FIG. 8 later. The read level determiner 173 finds a new read voltage RLd based on the search region SR.

The read level adjuster 170 may also include a register, i.e., a special function register (SFR) 175 that stores information necessary to define the reference region RR. The read level adjuster 170 may be implemented in software, hardware, or a combination thereof. When the read level adjuster 170 is implemented in software, the read level adjuster 170 may be formed as part of the function of the FTL and may be run by the CPU 120. The register 175 may be implemented in hardware and the search region determiner 171 and the read level determiner 173 may be implemented in software. The register 175 may be replaced with memory (e.g., the SRAM 125 or the non-volatile memory I/F 140).

Referring back to FIG. 2, although not shown, the non-volatile memory system 20 may also included other elements such as a read only memory (ROM) that stores code data executed at power-on, a clock module that generates a clock signal, and a timer.

Figure 4:
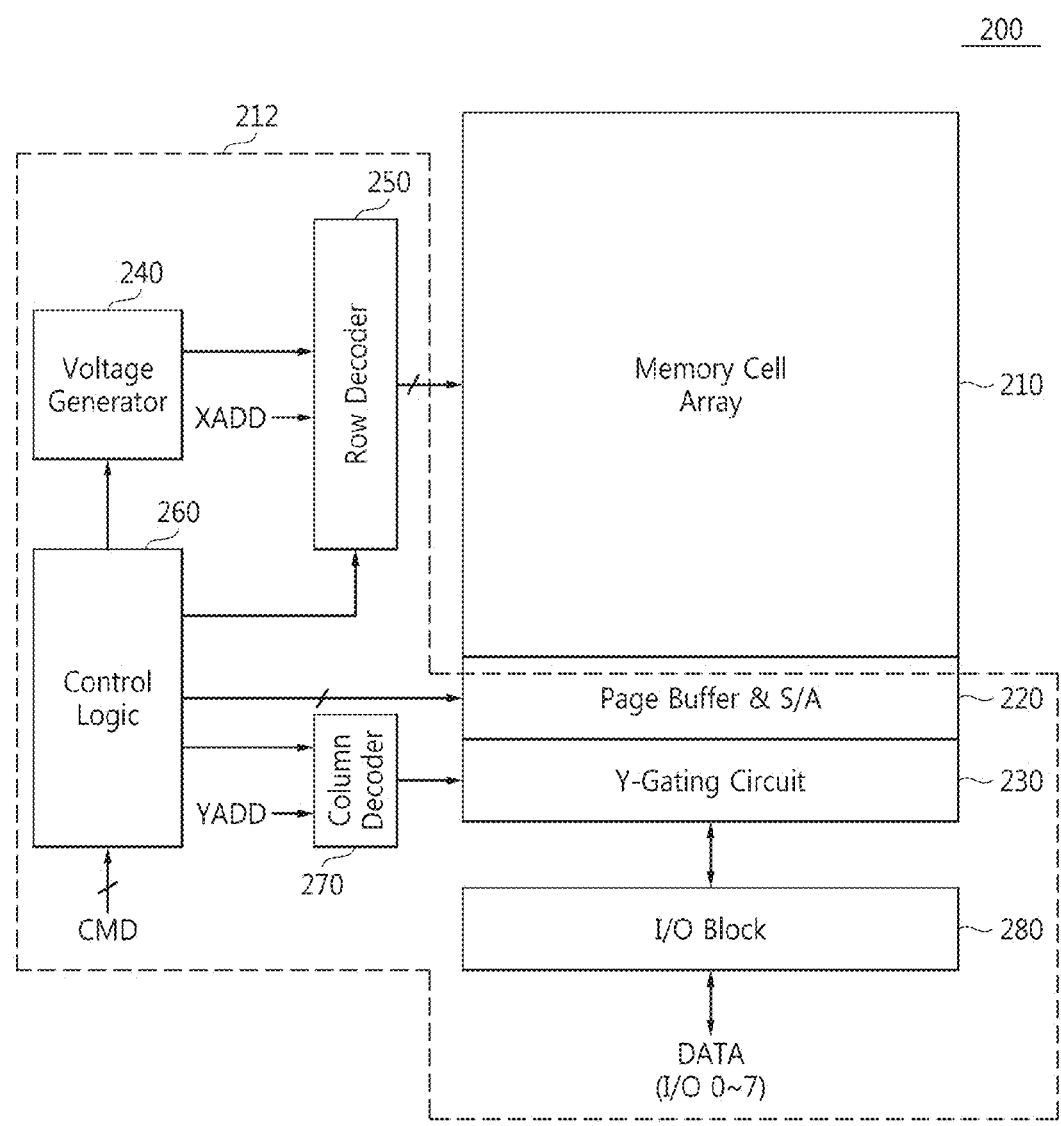
FIG. 4 is a detailed block diagram of a non-volatile memory device according to an exemplary embodiment of the disclosure.
Figure 5:
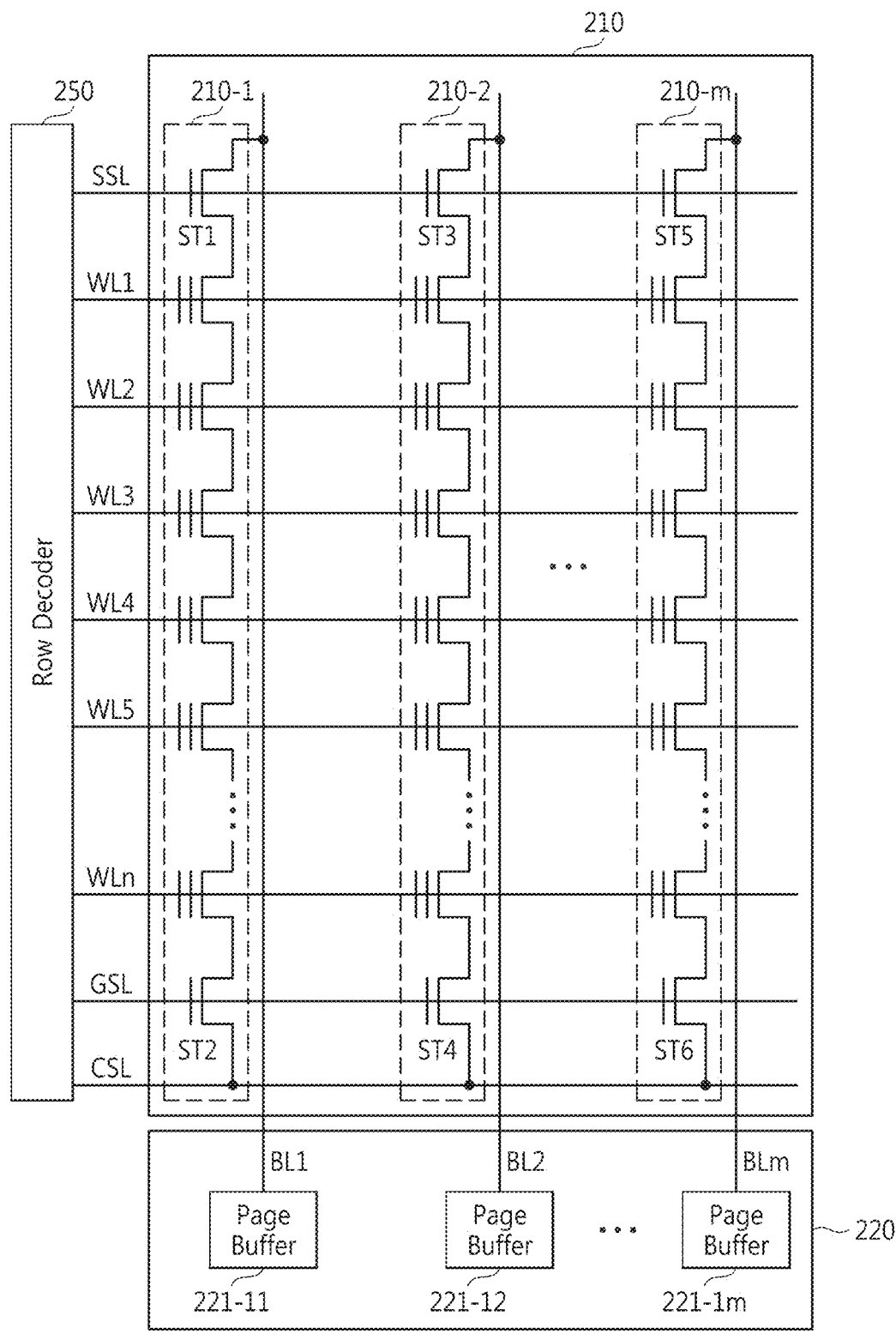
FIG. 5 is a diagram showing a memory cell array illustrated in FIG. 4 in detail according to an exemplary embodiment of the disclosure.
Figure 6:
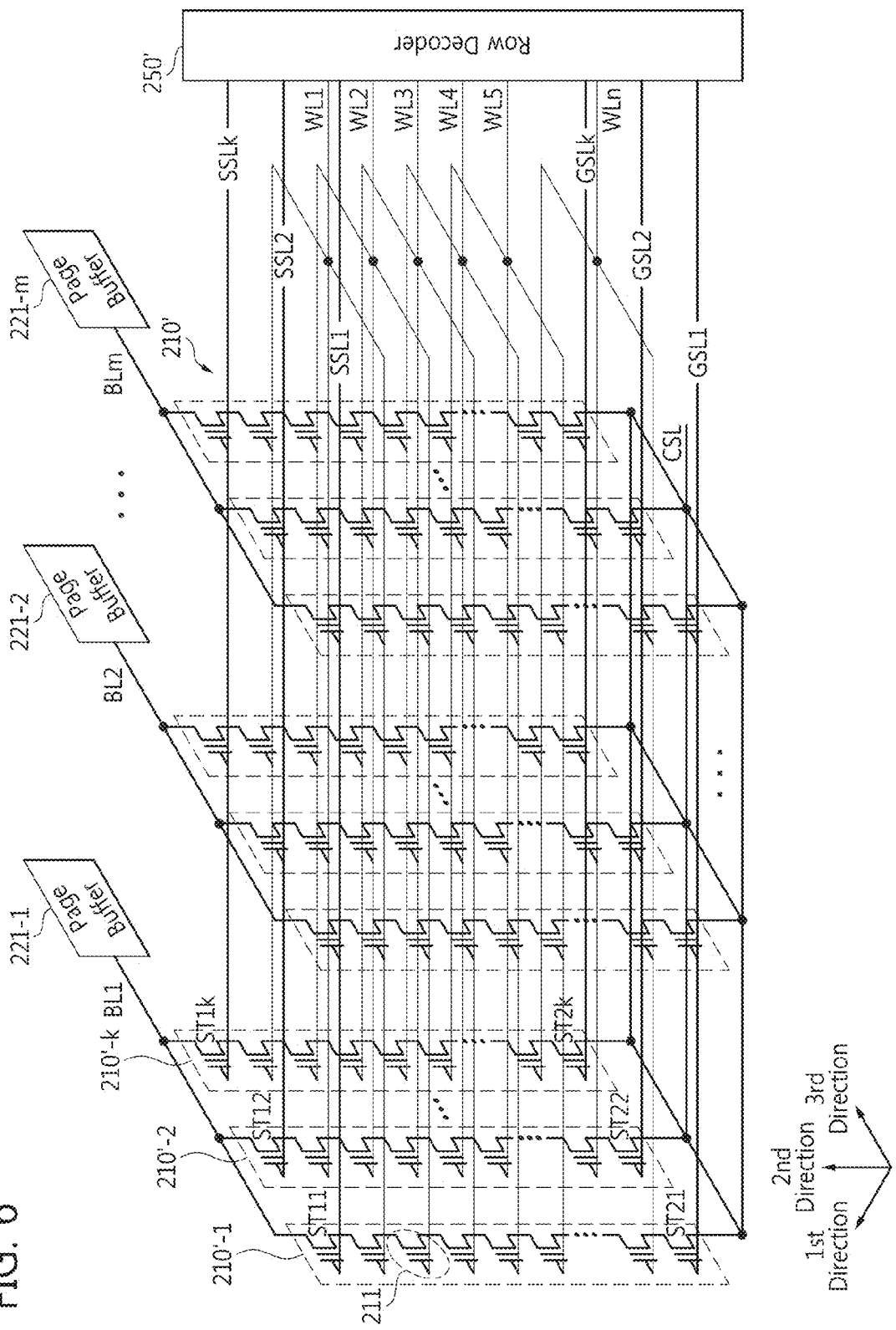
FIG. 6 is a diagram showing the memory cell array illustrated in FIG. 4 in detail according to an exemplary embodiment of the disclosure.

FIG. 4 is a detailed block diagram of the non-volatile memory device 200 according to an exemplary embodiment of the disclosure. FIG. 5 is a diagram showing a memory cell array 210 illustrated in FIG. 4 in detail according to an exemplary embodiment of the disclosure. FIG. 6 is a diagram showing the memory cell array 210 illustrated in FIG. 4 in detail according to another exemplary embodiment of the disclosure.

Referring to FIG. 4, the non-volatile memory device 200 includes the memory cell array 210 and an access circuit 212. The memory cell array 210 includes NAND memory cell strings respectively connected to bit lines and each of the NAND memory cell strings includes a plurality of non-volatile memory cells connected in series to one another. Each NAND memory cell string may be laid out (or embodied) on one plane (or layer) in two dimensions as illustrated in FIG. 5.

The non-volatile memory cells included in each NAND memory cell string may be formed using flash electrically erasable programmable read-only memory (EEPROM) cells which can store one or more bits. Accordingly, each of the non-volatile memory cells may be formed of a NAND flash memory cell, e.g., a multi-level cell (MLC), storing at least one bit.

The access circuit 212 accesses the memory cell array 210 to perform a data access operation, e.g., a program operation, a read operation, or an erase operation, according to a command (or command sets) and an address received from outside, e.g., the memory controller 100. The access circuit 212 may read data from selected memory cells in response to a read command output from the memory controller 100 and provide the data for the memory controller 100. The access circuit 212 may include a voltage generator 240, a row decoder 250, a control logic 260, a column decoder 270, a page buffer and sense amplifier (S/A) block 220, a Y-gating circuit 230, and an input/output (I/O) block 280.

The voltage generator 240 may generate a voltage necessary for a data access operation in response to a control code generated by the control logic 260. The voltage generator 240 generates a program voltage and a program-verify voltage necessary to perform a program operation, generates read voltages necessary to perform a read operation, generates an erase voltage and an erase-verify voltage necessary to perform an erase operation, and outputs the voltages necessary for each of the operations to the row decoder 250.

The control logic 260 controls the overall operation of the access circuit 212 in response to a control signal CMD output from the memory controller 100. The control logic 260 may control memory read state information to be sensed during a memory read operation and data that has been read to be output to the memory controller 100.

Under the control of the control logic 260, the column decoder 270 decodes column addresses YADD and outputs a plurality of selection signals to the Y-gating circuit 230. Under the control of the control logic 260, the row decoder 250 decodes row addresses XADD and outputs a plurality of selection signals to the memory cell array 210.

The page buffer and S/A block 220 includes a plurality of page buffers. The page buffers are respectively connected with bit lines. Each of the page buffers may operate as an S/A which senses and amplifies a voltage of each bit line during a read operation according to the control of the control logic 260. Each page buffer may also function as a latch that temporarily stores sensed and amplified data, i.e., data read from the memory cell array 210.

The Y-gating circuit 230 may control transmission of data between the page buffer and S/A block 220 and the I/O block 280 in response to the selection signals received from the column decoder 270. The I/O block 280 may transmit data, DATA, from outside to the Y-gating circuit 230 and may transmit data, DATA, from the Y-gating circuit 230 to the memory controller 100 through a plurality of I/O pins (or a data bus) I/O 0~7.

FIG. 5 is a diagram showing a memory cell array illustrated in FIG. 4 in detail according to an exemplary embodiment of the disclosure. Referring to FIGS. 4 and 5, a NAND memory cell string 210-1 of memory cell array 210 includes non-volatile memory cells connected in series between a string selection transistor ST1 connected to a bit line BL1 and a ground selection transistor ST2 connected to a common source line (CSL). A gate of the string selection transistor ST1 is connected to a string selection line (SSL). Gates of the respective non-volatile memory cells are connected to the word lines WL1 through WLn, respectively. A gate of the ground selection transistor ST2 is connected to a ground selection line (GSL). NAND memory cell strings 210-2 through 210-m are configured similarly to the configuration of NAND memory cell string 210-1.

More specifically, a NAND memory cell string 210-2 includes non-volatile memory cells connected in series between a string selection transistor ST3 connected to a bit line BL2 and a ground selection transistor ST4 connected to the common source line CSL. A gate of the string selection transistor ST3 is connected to the string selection line SSL. Gates of the respective non-volatile memory cells are connected to the word lines WL1 through WLn, respectively. A gate of the ground selection transistor ST4 is connected to the ground selection line GSL.

Similarly, a NAND memory cell string 210-m includes non-volatile memory cells connected in series between a string selection transistor ST5 connected to a bit line BLm and a ground selection transistor ST6 connected to the common source line CSL. A gate of the string selection transistor ST5 is connected to the string selection line SSL. Gates of the respective non-volatile memory cells are connected to the word lines WL1 through WLn, respectively. A gate of the ground selection transistor ST6 is connected to the ground selection line GSL.

Within page buffer and S/A block 220, NAND memory cell string 210-1 is connected to page buffer 221-11 through bit line BL1. Similarly, NAND memory cell string 210-2 is connected to page buffer 221-12 through bit line BL2 and NAND memory cell string 210-m is connected to page buffer 221-1m through bit line BLm. The number of word lines may vary with embodiments.

Alternatively, the memory cell array 210 may be implemented in three dimensions, as illustrated in FIG. 6. The three-dimensional memory cell array 210' may be monolithically formed within at least one physical level of an array of memory cells having an active region placed on or above a silicon substrate and may include a circuit related with the operation of the memory cells. The circuit may be formed within or on (or above) the substrate. The term "monolithic" means that a layer at one level of the array is directly deposited on a layer at an underlying level of the array.

The three-dimensional memory cell array 210' may include a vertically oriented NAND string in which at least one memory cell is positioned on another memory cell. The at least one memory cell 211 may include a charge trap layer. The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,559,235; and U.S. Pat. Pub. No. 2011/0233648.

The three-dimensional memory cell array 210' is formed with structures extending in first through third directions. In detail, the three-dimensional memory cell array 210' includes memory cells stacked in the second directions (e.g., a direction perpendicular to a substrate). Accordingly, at least one memory cell is positioned on another memory cell, as described above.

For instance, in the embodiments illustrated in FIG. 6, memory cells connected to a fourth word line WL4 are positioned on memory cells connected to a fifth word line WL5, memory cells connected to a third word line WL3 are positioned on the memory cells connected to the fourth word line WL4, and memory cells connected to a second word line WL2 are positioned on the memory cells connected to the third word line WL3.

Due to such a three-dimensional structure, the size (e.g., height, width or length) of each of word lines WL1 through WLn in the three-dimensional memory cell array 210' may be different. The size of a memory cell (e.g., the length of width of a transistor included in the memory cell) may also be different according to the position of the memory cell. Accordingly, the threshold voltage distribution of memory cells may be different among the word lines WL1 through WLn of the three-dimensional memory cell array 210'. As a result, an optimal read level may be different among the word lines WL1 through WLn and a search region for or a method of finding an optimal read level may be different for each of the word lines WL1 through WLn.

Referring to FIGS. 4 and 6, a NAND memory cell string 210'-1 includes non-volatile memory cells 211 connected in series between a string selection transistor ST11 connected to a bit line BL1 and a ground selection transistor ST21 connected to a common source line CSL. A gate of the string selection transistor ST11 is connected to a string selection line SSL1. Gates of the respective non-volatile memory cells are connected to the word lines WL1 through WLn, respectively. A gate of the ground selection transistor ST21 is connected to a ground selection line GSL1. NAND memory cell strings 210'-2 through 210'-k are configured similarly to the configuration of NAND memory cell string 210'-1.

More specifically, a NAND memory cell string 210'-2 includes non-volatile memory cells 211 connected in series between a string selection transistor ST12 connected to the bit line BL1 and a ground selection transistor ST22 connected to the common source line CSL. A gate of the string selection transistor ST12 is connected to a string selection line SSL2. Gates of the respective non-volatile memory cells are connected to the word lines WL1 through WLn, respectively. A gate of the ground selection transistor ST21 is connected to a ground selection line GSL2.

Similarly, a NAND memory cell string 210'-k includes non-volatile memory cells 211 connected in series between a string selection transistor ST1k connected to the bit line BL1 and a ground selection transistor ST2k connected to the common source line CSL. A gate of the string selection transistor ST1k is connected to a string selection line SSLk. Gates of the respective non-volatile memory cells are connected to the word lines WL1 through WLn, respectively. A gate of the ground selection transistor ST2k is connected to a ground selection line GSLk.

NAND memory cell strings 210'-1 through 210'-k are connected to page buffer 221-1 through bit line BL1. Similarly, k NAND memory cell strings configured in the same manner as NAND memory cell strings 210'-1 through 210'-k are connected to page buffer 221-2 through bit line BL2 and k NAND memory cell strings configured in the same manner as NAND memory cell strings 210'-1 through 210'-k are connected to page buffer 221-m through bit line BLm. The number of word lines may vary with embodiments. In the embodiment illustrated by FIG. 6, row decoder 250' is a specific implementation of row decoder 250.

FIG. 7 is a diagram of threshold voltage distributions E, P1, P2, and P3 in an initial erased state and a programmed state of the non-volatile memory device 200 according to an exemplary embodiment of the disclosure. When the non-volatile memory device 200 is formed of 2-bit MLCs, it may initially have the threshold voltage distributions E, P1, P2, and P3 shown in FIG. 7.

Even memory cells to which the same data has been programmed may not have the same threshold voltage because of a distinction in electrical characteristics between memory cells of the non-volatile memory device 200. Therefore, as shown in FIG. 7, threshold voltages of memory cells may form a threshold voltage distribution having a certain range.

Figure 8A:
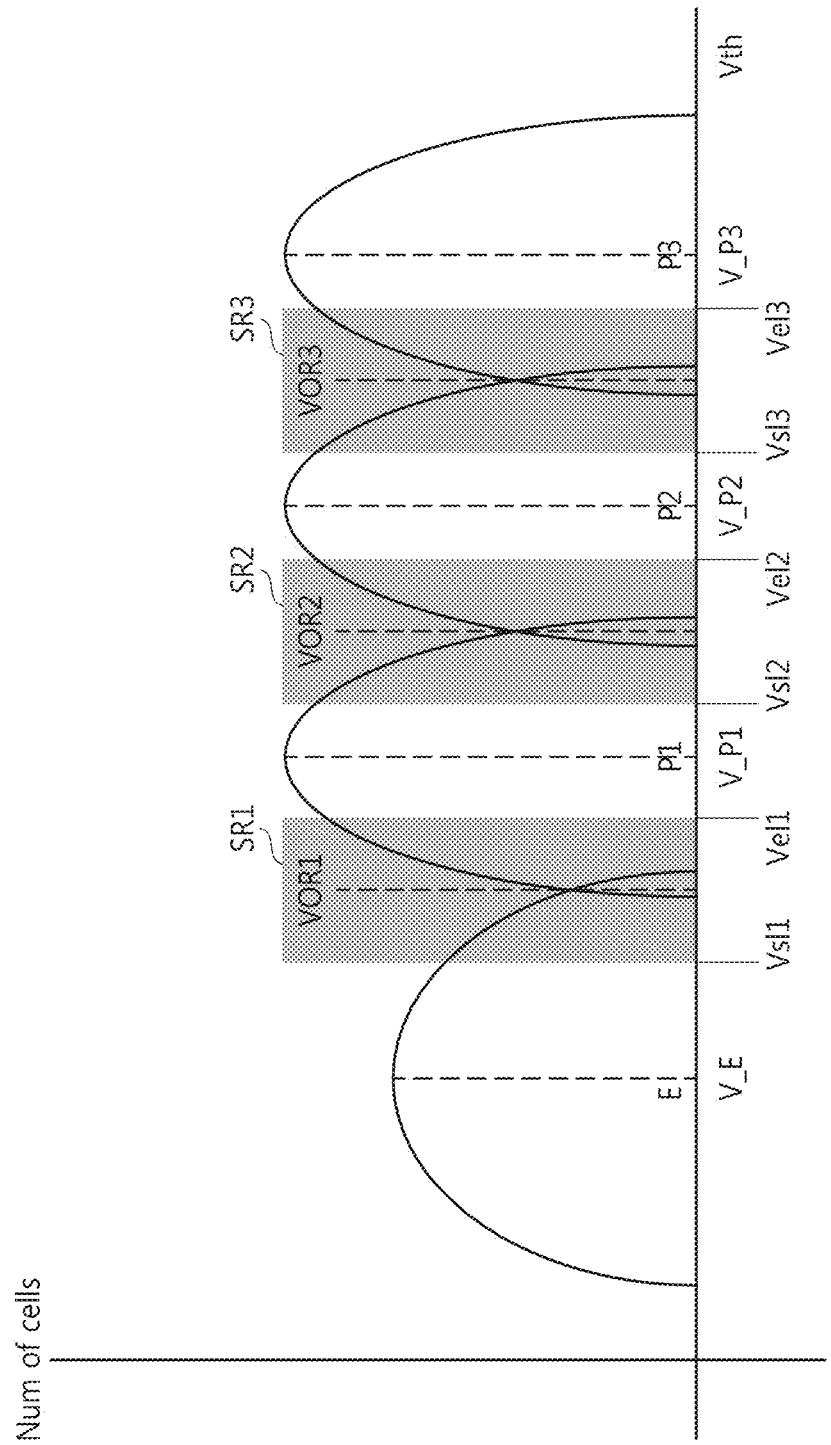

FIGS. 8A through 8C are diagrams for explaining a search region and a reference region according to an exemplary embodiment of the disclosure. FIGS. 8A through 8C illustrate threshold voltage distributions in the erased and programmed states that have been changed from the initial states when programming and erasing are repeated over time after a 2-bit MLC non-volatile memory is programmed.

It can be inferred from FIG. 7 and FIGS. 8A through 8C that the distribution of threshold voltages changes when memory cells are repeatedly subjected to program and erase operations. For instance, a threshold voltage distribution may shift (for examples, to the left or to the right) or adjacent threshold voltage distributions may increasingly overlap each other.

In case of a three-dimensional memory cell array, either or both of the size (e.g., the height, width or length) of each of the word lines WL1 through WLn and the size of a memory cell (e.g., the length of width of a transistor forming the memory cell) may be different among the word lines WL1 through WLn due to the three-dimensional structure and processes, as described above. Therefore, the threshold voltage distribution of memory cells may also be different among the word lines WL1 through WLn.

As the threshold voltage distribution changes, read data may have many errors (i.e., bit errors) when a fixed read voltage is used. Accordingly, a read level search method is used to find an optimal read voltage that allows a bit error rate of the read data to be reduced. Read voltages giving the lowest bit error rate in the threshold voltage distributions E, P1, P2, and P3 illustrated in FIGS. 8A through 8C may be voltages VOR1, VOR2, and VOR3 corresponding to valleys among adjacent threshold voltage distributions. In order to find the optimal read voltages corresponding to or adjacent to the valleys among the threshold voltage distributions, search regions SR1, SR2, and SR3 need to be set appropriately. When the search region SR1, SR2, or SR3 is not appropriately set, an optimal read voltage may be wrongly set to another valley during a read level search, resulting in error correction fail.

Referring to FIG. 8A, the first search region SR1 may be defined by a first start read voltage Vsl1 and a first end read voltage Vel1. The second search region SR2 may be defined by a second start read voltage Vsl2 and a second end read voltage Vel2. The third search region SR3 may be defined by a third start read voltage Vsl3 and a third end read voltage Vel3.

The search region SR may refer to one of the first through third search regions SR1, SR2, and SR3. The search region SR may be set initially and may be changed under predetermined conditions (e.g., when an error occurs due to a predetermined read voltage). The reference region RR may be set in advance. The reference region RR may be defined by threshold voltages V_E and V_P1, V_P1 and V_P2, or V_P2 and V_P3 that have a maximum number of memory cells in adjacent threshold voltage distributions.

In the embodiment illustrated in FIG. 8A, a first reference region may be defined by the threshold voltages (hereinafter, referred to as maximum threshold voltages) V_E and V_P1 that have a maximum number of memory cells in the erased-state threshold voltage distribution E and the first-programmed-state threshold voltage distribution P1. A second reference region may be defined by the maximum threshold voltages V_P1 and V_P2 in the first-programmed-state threshold voltage distribution P1 and the second-programmed-state threshold voltage distribution P2. A third reference region may be defined by the maximum threshold voltages V_P2 and V_P3 in the second-programmed-state threshold voltage distribution P2 and the third-programmed-state threshold voltage distribution P3.

A reference region may be defined by predetermined number of memory cells according to an exemplary embodiment. Referring to FIG. 8B, the first reference region may be defined by a number NE_on of memory cells having a threshold voltage lower than the maximum threshold voltage V_E in the erased-state threshold voltage distribution E and a number NP1_on of memory cells having a threshold voltage lower than the maximum threshold voltage V_P1 in the first-programmed-state threshold voltage distribution P1. The number NE_on of memory cells having a threshold voltage lower than the maximum threshold voltage V_E in the erased-state threshold voltage distribution E is the number of memory cells that are sensed as on-cells when the maximum threshold voltage V_E in the erased-state threshold voltage distribution E is used as a read voltage and is referred to as an erase reference on-cell number NE_on. The number NP1_on of memory cells having a threshold voltage lower than the maximum threshold voltage V_P1 in the first-programmed-state threshold voltage distribution P1 is the number of memory cells that are sensed as on-cells when the maximum threshold voltage V_P1 in the first-programmed-state threshold voltage distribution P1 is used as a read voltage and is referred to as a first program reference on-cell number NP1_on.

Similarly to the first reference region, the second reference region may be defined by the first program reference on-cell number NP1_on and a number of memory cells having a threshold voltage lower than the maximum threshold voltage V_P2 in the second-programmed-state threshold voltage distribution P2 (hereinafter, referred to as a second program reference on-cell number NP2_on). The third reference region may be defined by the second program reference on-cell number NP2_on and a number of memory cells having a threshold voltage lower than the maximum threshold voltage V_P3 in the third-programmed-state threshold voltage distribution P3 (hereinafter, referred to as a third program reference on-cell number NP3_on).

Referring to FIG. 8C, the first reference region may be defined by a number NE_off of memory cells having a threshold voltage higher than the maximum threshold voltage V_E in the erased-state threshold voltage distribution E and a number NP1_off of memory cells having a threshold voltage higher than the maximum threshold voltage V_P1 in the first-programmed-state threshold voltage distribution P1. The number NE_off of memory cells having a threshold voltage higher than the maximum threshold voltage V_E in the erased-state threshold voltage distribution E is the number of memory cells that are sensed as off-cells when the maximum threshold voltage V_E in the erased-state threshold voltage distribution E is used as a read voltage and is referred to as an erase reference off-cell number NE_off. The number NP1_off of memory cells having a threshold voltage higher than the maximum threshold voltage V_P1 in the first-programmed-state threshold voltage distribution P1 is the number of memory cells that are sensed as off-cells when the maximum threshold voltage V_P1 in the first-programmed-state threshold voltage distribution P1 is used as a read voltage and is referred to as a first program reference off-cell number NP1_off.

Similarly to the first reference region, the second reference region may be defined by the first program reference off-cell number NP1_off and a number of memory cells having a threshold voltage higher than the maximum threshold voltage V_P2 in the second-programmed-state threshold voltage distribution P2 (hereinafter, referred to as a second program reference off-cell number NP2_off). The third reference region may be defined by the second program reference off-cell number NP2_off and a number of memory cells having a threshold voltage higher than the maximum threshold voltage V_P3 in the third-programmed-state threshold voltage distribution P3 (hereinafter, referred to as a third program reference off-cell number NP3_off).

The erase reference on-cell number NE_on, the first through third program reference on-cell numbers NP1_on, NP2_on, and NP3_on, the erase reference off-cell number NE_off, and the first through third program reference off-cell number NP1_off, NP2_off, and NP3_off each may be calculated by counting on-cells or off-cells after applying a corresponding read voltage.

Alternatively, each of the numbers NE_on, NP1_on, NP2_on, NP3_on, NE_off, NP1_off, NP2_off, and NP3_off may be calculated using a statistical method such as averaging instead of actually counting on-cells or off-cells. For instance, when the memory controller 100 allows the number of memory cells in each of the erased state and the first through third programmed states to be uniform using a randomizing method, the numbers NE_on, NP1_on, NP2_on, NP3_on, NE_off, NP1_off, NP2_off, and NP3_off can be predetermined without an operation of actually counting on-cells or off-cells. When the number of memory cells is N, the erase reference on-cell number NE_on and the first through third program reference on-cell numbers NP1_on, NP2_on, and NP3_on may be determined as N/8, 3*(N/8), 5*(N/8), and 7*(N/8), respectively, which may be stored in advance in the register 175 (in FIG. 3). In addition, the erase reference off-cell number NE_off and the first through third program reference off-cell numbers NP1_off, NP2_off, and NP3_off may be determined as 7*(N/8), 5*(N/8), 3*(N/8), and N/8, respectively, which may be stored in the register 175.

The search regions SR1 through SR3 and the reference regions illustrated in FIGS. 8A through 8C may be different among the word lines WL1 through WLn. As described above, a threshold voltage distribution may be different among the word lines WL1 through WLn in a three-dimensional memory cell array, and therefore, a search region and a reference region may be differently set in each of the word lines WL1 through WLn. For instance, the first search region SR1 for the first word line WL1 may be different from the first search region SR1 for the n-th word lines WLn.

FIG. 9 is a diagram for explaining a search region and a reference region according to an exemplary embodiment of the disclosure. Threshold voltage distributions illustrated in FIG. 9 may have been more shifted than the threshold voltage distributions illustrated in FIGS. 8A through 8C. Accordingly, each of search regions SR1', SR2', and SR3' is not between adjacent threshold voltage distributions, that is, each of the search regions SR1', SR2', and SR3' is not close to the valley between the adjacent threshold voltage distributions, but it may be set to be adjacent to a peak of a threshold voltage distribution or close to another valley. Accordingly, the first start read voltage Vsl1' and first end read voltage Vel1' defining SR1', the second start read voltage Vsl2' and second end read voltage Vel2' defining SR2', and the third start read voltage Vsl3' and third end read voltage Vel3' defining SR3' may be correspondingly shifted. Reference regions may be set in the same manner as described with reference to FIGS. 8A through 8C.

Although the threshold voltage distributions, the search region SR and the reference region RR, when the non-volatile memory device 200 includes 2-bit MLCs, are illustrated in FIGS. 7 through 9, the disclosure is not restricted to these embodiments illustrated in FIGS. 7 through 9. The non-volatile memory device 200 may include at least 3-bit MLCs. When the non-volatile memory device 200 includes 3-bit MLCs, threshold voltage distributions may include the erased-state threshold voltage distribution E and first through seventh programmed-state threshold voltage distributions P1, P2, P3, P4, P5, P6, and P7; and the search region SR and the reference region RR will be different depending on these threshold voltage distributions.

Figure 10:
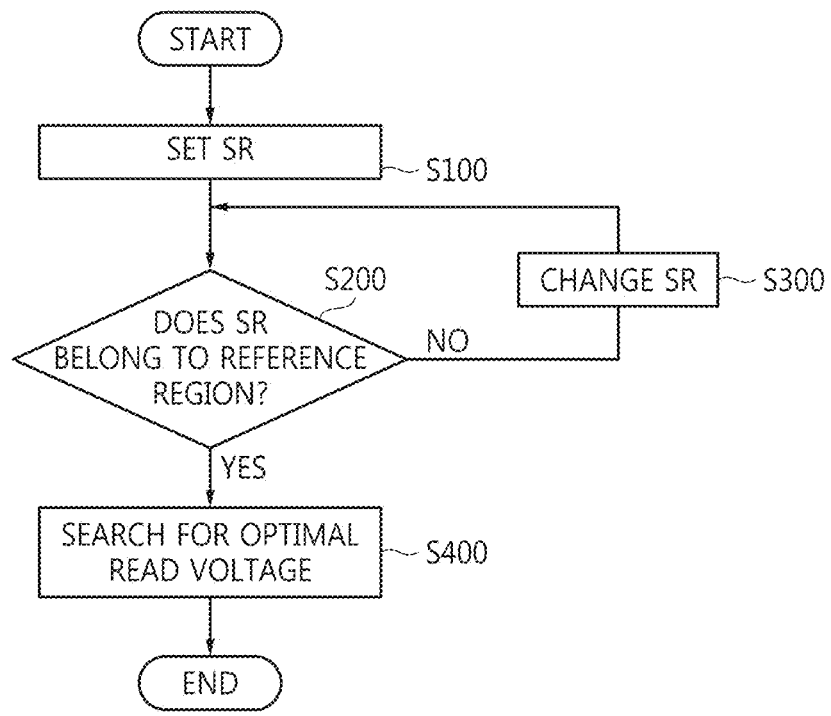
FIG. 10 is a flowchart of a method of operating a non-volatile memory device according to an exemplary embodiment of the disclosure.

FIG. 10 is a flowchart of a method of operating a non-volatile memory device according to an exemplary embodiment of the disclosure. The method illustrated in FIG. 10 may be performed by the non-volatile memory system 20 illustrated in FIGS. 1 through 6. According to the embodiment of the disclosure, an operation of setting a search region including an optimal read voltage is performed before searching for the optimal read voltage.

Referring to FIGS. 1 through 10, the search region SR is set in operation S100. The search region SR may be defined by the start read voltage Vsl and the end read voltage Vel, as described above with reference to FIGS. 8A through 8C. The search region SR may be set differently for each word line.

Thereafter, whether the search region SR belongs to the reference region RR is determined in operation S200. As described above with reference to FIGS. 8A through 8C, the reference region RR may be predetermined.

When it is determined that the search region SR does not belong to the reference region RR, the search region SR is changed in operation S300. For instance, the search region SR may be shifted to the right (that is, the start read voltage Vsl and the end read voltage Vel may be increased) or it may be shifted to the left (that is, the start read voltage Vsl and the end read voltage Vel may be decreased) to change the search region SR.

Whether the changed search region SR belongs to the reference region RR may be determined in operation S200. When the changed search region SR does not belong to the reference region RR, the search region SR is changed again in operation S300 and whether the changed search region SR belongs to the reference region RR is determined in operation S200.

When it is determined that search region SR belongs to the reference region RR (i.e., in case of YES) in operation S200, an optimal read voltage is searched for based on the search region SR in operation S400. As described above, a method of searching for the optimal read voltage may be different for each word line.

Figure 11:
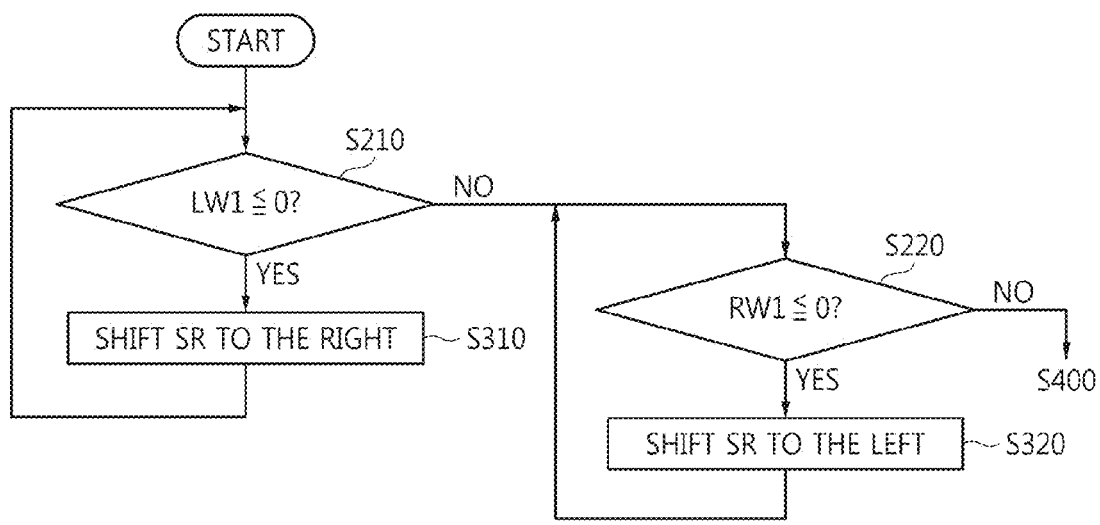
FIG. 11 is a detailed flowchart of a part of the method illustrated in FIG. 10 according to an exemplary embodiment of the disclosure.
Figure 12:
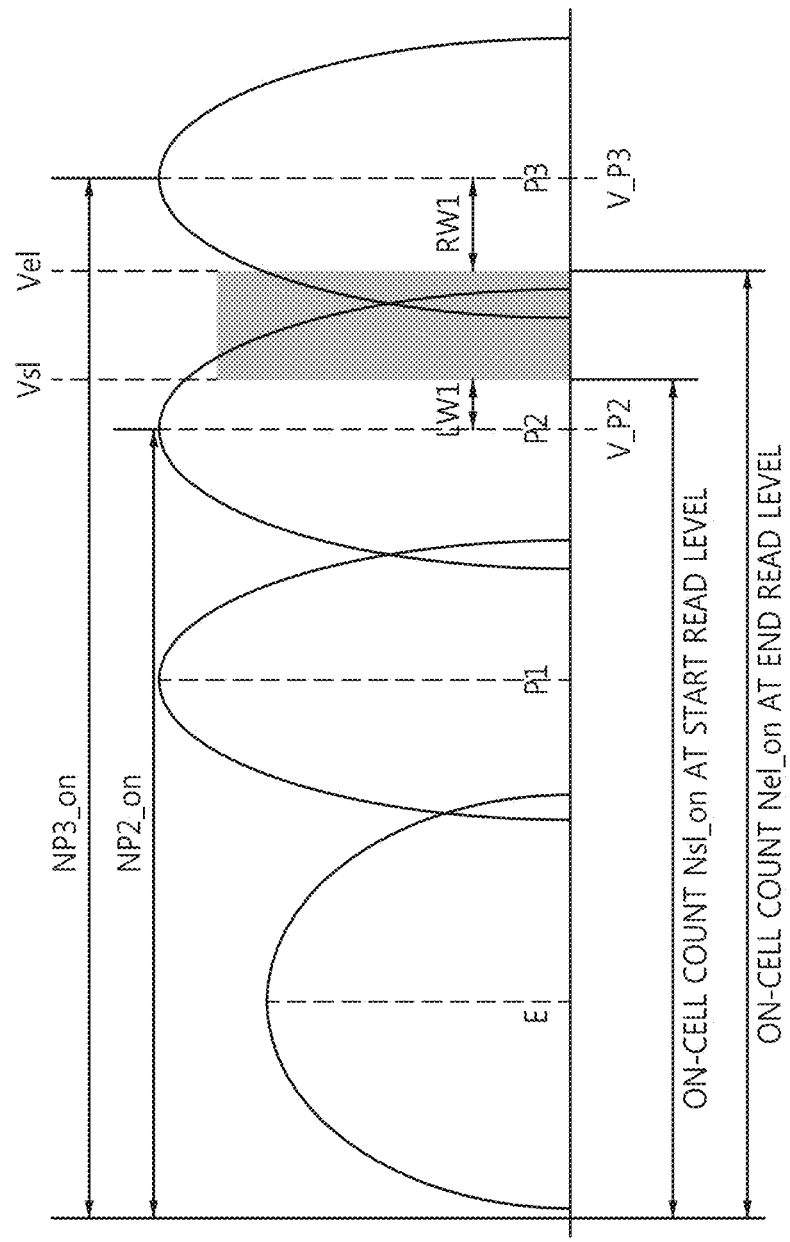
FIG. 12 is a diagram of threshold voltage distributions for explaining the method illustrated in FIG. 11.

FIG. 11 is a detailed flowchart of a part of the method illustrated in FIG. 10 according to an exemplary embodiment of the disclosure. FIG. 12 is a diagram of threshold voltage distributions for explaining the method illustrated in FIG. 11. The method illustrated in FIG. 11 may correspond to a procedure for setting the search region SR before searching for an optimal read voltage between the adjacent second and third programmed-state threshold voltage distributions P2 and P3. In other words, the method illustrated in FIG. 11 may correspond to operations S200 and S300 illustrated in FIG. 10 according to an exemplary embodiment of the disclosure.

Referring to FIGS. 11 and 12, whether a first width LW1 is at most 0 is determined in operation S210 in order to determine whether the search region SR belongs to the reference region RR. The search region SR may be defined by the start read voltage Vsl and the end read voltage Vel. The first width LW1 is a difference between a value (hereinafter, referred to as a first memory cell count) Nsl_on obtained by counting first memory cells having a threshold voltage lower than the start read voltage Vsl and the number of first reference memory cells, that is, a result of subtracting the number of first reference memory cells from the first memory cell count Nsl_on.

The first memory cell count Nsl_on is the number of memory cells sensed as on-cells when the start read voltage Vsl is used as a read voltage. The number of first reference memory cells is the number NP2_on of memory cells having a threshold voltage lower than the first reference threshold voltage V_P2 (i.e., the maximum threshold voltage V_P2 in the second programmed-state threshold voltage distribution P2), i.e., the second program reference on-cell number NP2_on. The second program reference on-cell number NP2_on may be predetermined without actual counting. The second program reference on-cell number NP2_on may be calculated or estimated using a statistical or stochastic method.

When it is determined that the first width LW1 is at most 0 (in case of YES) in operation S210, the search region SR is shifted to the right in operation S310. In detail, the start read voltage Vsl and the end read voltage Vel may be increased by a shift voltage to shift the search region SR to the right in operation S310. The shift voltage may be predetermined.

Alternatively, the shift voltage may not be a fixed value but may be changed according to the difference between the first memory cell count Nsl_on and the first reference memory cell number NP2_on. For instance, when the first memory cell count Nsl_on is less than the first reference memory cell number NP2_on by at least first threshold value, a first shift voltage may be used. When the first memory cell count Nsl_on is less than the first reference memory cell number NP2_on by at most the first threshold value, a second shift voltage may be used. At this time, the first shift voltage may be greater than the second shift voltage. As described above, the difference between the first memory cell count Nsl_on and the first reference memory cell number NP2_on may be divided into at least two ranges and a different shift voltage may be used for each range.

When the first memory cell count Nsl_on is less than the first reference memory cell number NP2_on by at least the first threshold value, the first memory cell count Nsl_on may be additionally compared with another reference memory cell number which may be the number NP1_on of memory cells having a threshold voltage lower than the maximum threshold voltage V_P1 in the first programmed-state threshold voltage distribution P1, i.e., the first program reference on-cell number NP1_on. In other words, when the difference between the first memory cell count Nsl_on and the first reference memory cell number NP2_on is great, the first memory cell count Nsl_on is additionally compared with another reference memory cell number NP1_on in order to adjust the shift voltage.

Operations S210 and S310 may be repeated until the first width LW1 is greater than 0. When it is determined that the first width LW1 is greater than 0 (in case of NO) in operation S210, whether a second width RW1 is at most 0 is determined in operation S220.

The second width RW1 is a difference between the number of second reference memory cells and a value (hereinafter, referred to as a second memory cell count) Nel_on obtained by counting second memory cells having a threshold voltage lower than the end read voltage Vel, that is, a result of subtracting the second memory cell count Nel_on from the number of second reference memory cells.

The second memory cell count Nel_on is the number of memory cells sensed as on-cells when the end read voltage Vel is used as a read voltage. The number of second reference memory cells is the number NP3_on of memory cells having a threshold voltage lower than the third reference threshold voltage V_P3 (i.e., the maximum threshold voltage V_P3 in the third programmed-state threshold voltage distribution P3), i.e., the third program reference on-cell number NP3_on. The third program reference on-cell number NP3_on may be predetermined without actual counting. Like the second program reference on-cell number NP2_on, the third program reference on-cell number NP3_on may be calculated or estimated using a statistical or stochastic method.

When it is determined that the second width RW1 is at most 0 (in case of YES) in operation S220, the search region SR is shifted to the left in operation S320. In detail, the start read voltage Vsl and the end read voltage Vel may be decreased by a shift voltage to shift the search region SR to the left in operation S320. The shift voltage used in operation S320 may be the same as or different from that used in operation S310. The shift voltage used in operation S320 may be a fixed value or may be changed according to the difference between the second memory cell count Nel_on and the second reference memory cell number NP3_on.

Operations S220 and S320 may be repeated until the second width RW1 is greater than 0. When it is determined that the second width RW1 is greater than 0 (in case of NO) in operation S220, operation S400 illustrated in FIG. 10 may be performed.

The order of operations S210 and S220 may be changed. For instance, whether the second width RW1 is at most 0 may be first determined in operation S220 and the search region SR is shifted to the left in operation S320 until the second width RW1 is greater than 0. Thereafter, whether the first width LW1 is at most 0 may be determined in operation S210 and the search region SR is shifted to the right in operation S310 until the first width LW1 is greater than 0.

Figure 13:
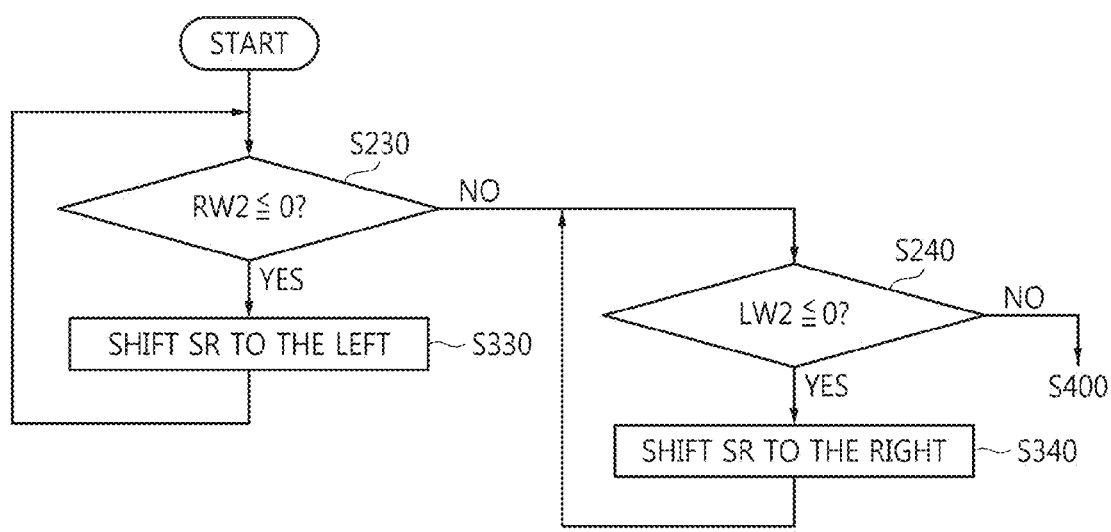
FIG. 13 is a detailed flowchart of a part of the method illustrated in FIG. 10 according to an exemplary embodiment of the disclosure.
Figure 14:
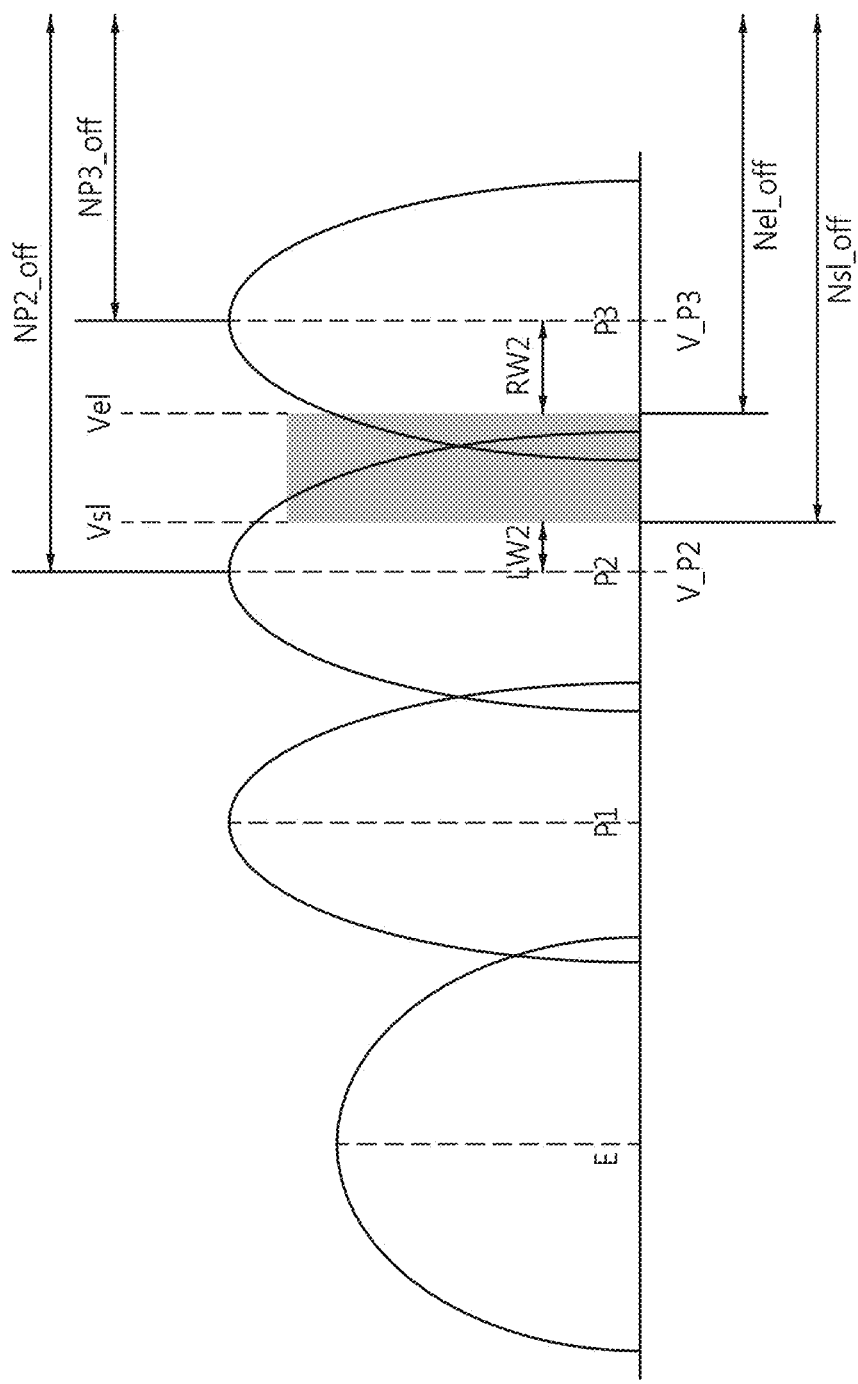
FIG. 14 is a diagram of threshold voltage distributions for explaining the method illustrated in FIG. 13.

FIG. 13 is a detailed flowchart of a part of the method illustrated in FIG. 10 according to an exemplary embodiment of the disclosure. FIG. 14 is a diagram of threshold voltage distributions for explaining the method illustrated in FIG. 13. The method illustrated in FIG. 13 may correspond to a procedure for setting the search region SR before searching for an optimal read voltage between the adjacent second and third programmed-state threshold voltage distributions P2 and P3. In other words, the method illustrated in FIG. 13 may correspond to operations S200 and S300 illustrated in FIG. 10 according to an exemplary embodiment of the disclosure.

Referring to FIGS. 13 and 14, whether a third width RW2 is at most 0 is determined in operation S230 in order to determine whether the search region SR belongs to the reference region RR. The third width RW2 is a difference between a value (hereinafter, referred to as a third memory cell count) Nel_off obtained by counting third memory cells having a threshold voltage higher than the end read voltage Vel and a third reference memory cell number, that is, a result of subtracting the third reference memory cell number from the third memory cell count Nel_off.

The third memory cell count Nel_off is the number of memory cells sensed as off-cells when the end read voltage Vel is used as a read voltage. The third reference memory cell number is the number of memory cells having a threshold voltage higher than the third reference threshold voltage V_P3, i.e., the third program reference off-cell number NP3_off. The third program reference off-cell number NP3_off may be predetermined without actual counting. Like the second and third program reference on-cell numbers NP2_on and NP3_on, the third program reference off-cell number NP3_off may be calculated or estimated using a statistical or stochastic method.

When it is determined that the third width RW2 is at most 0 (in case of YES) in operation S230, the search region SR is shifted to the left in operation S330. In detail, the start read voltage Vsl and the end read voltage Vel may be decreased by a shift voltage to shift the search region SR to the left in operation S330.

Operations S230 and S330 may be repeated until the third width RW2 is greater than 0. When it is determined that the third width RW2 is greater than 0 (in case of NO) in operation S230, whether a fourth width LW2 is at most 0 is determined in operation S240.

The fourth width LW2 is a difference between the number of fourth reference memory cells and a value (hereinafter, referred to as a fourth memory cell count) Nsl_off obtained by counting fourth memory cells having a threshold voltage higher than the start read voltage Vsl, that is, a result of subtracting the fourth memory cell count Nsl_off from the number of fourth reference memory cells.

The fourth memory cell count Nsl_off is the number of memory cells sensed as off-cells when the start read voltage Vsl is used as a read voltage. The number of fourth reference memory cells is the number of memory cells having a threshold voltage higher than the second reference threshold voltage V_P2 (i.e., the maximum threshold voltage V_P2 in the second programmed-state threshold voltage distribution P2), i.e., the second program reference off-cell number NP2_off. The second program reference off-cell number NP2_off may be predetermined without actual counting. The second program reference off-cell number NP2_off may be calculated or estimated using a statistical or stochastic method.

When it is determined that the fourth width LW2 is at most 0 (in case of YES) in operation S240, the search region SR is shifted to the right in operation S340. In detail, the start read voltage Vsl and the end read voltage Vel may be increased by a shift voltage to shift the search region SR to the right in operation S340.

Operations S240 and S340 may be repeated until the fourth width LW2 is greater than 0. When it is determined that the fourth width LW2 is greater than 0 (in case of NO) in operation S240, operation S400 illustrated in FIG. 10 may be performed.

The order of operations S230 and S240 may be changed. For instance, whether the fourth width LW2 is at most 0 may be first determined in operation S240 and the search region SR is shifted to the right in operation S340 until the fourth width LW2 is greater than 0. Thereafter, whether the third width RW2 is at most 0 may be determined in operation S230 and the search region SR is shifted to the left in operation S330 until the third width RW2 is greater than 0.

FIGS. 15A through 15D are diagrams for explaining the method illustrated in FIGS. 10 and 11 according to exemplary embodiments of the disclosure. FIGS. 15A through 15D are provided to described the method illustrated in FIGS. 10 and 11 in detail.

Referring to FIGS. 10 and 11 and FIGS. 15A through 15D, a first search region is set. The first search region is defined by a first start read voltage Vsl_a and a first end read voltage Vel_a in operation S100. In order to determined whether the first search region belongs to a reference region, whether a number Nsl_a of first memory cells having a threshold voltage lower than the first start read voltage Vsl_a is greater than the first reference memory cell number, i.e., the second program reference on-cell number NP2_on is determined in operation S210.

In the embodiments illustrated in FIG. 15A, since the first memory cell count Nsl_a is greater than the second program reference on-cell number NP2_on (i.e., NO in operation S210), whether a value Nel_a obtained by counting second memory cells having a threshold voltage lower than the first end read voltage Vel_a is equal to or less than the second reference memory cell number, i.e., the third program reference on-cell number NP3_on is determined in operation S220. Since the second memory cell count Nel_a is greater than the third program reference on-cell number NP3_on (i.e., YES in operation S220), the first start read voltage Vsl_a and the first end read voltage Vel_a are shifted to the left by a shift voltage Vsft in operation S320. The shift voltage Vsft may be a voltage corresponding to ⅓ of the difference (or gap) between the first end read voltage Vel_a and the first start read voltage Vsl_a, but the disclosure is not restricted to the current embodiments.

A second search region set by shifting the first start read voltage Vsl_a and the first end read voltage Vel_a to the left by the shift voltage Vsft is illustrated in FIG. 15B. Referring to FIG. 15B, the second search region is defined by a second start read voltage Vsl_b and the second end read voltage Vel_b.

Whether a number Nel_b of memory cells having a threshold voltage lower than the second end read voltage Vel_b is equal to or less than the third program reference on-cell number NP3_on is determined in operation S220. In the embodiment illustrated in FIG. 15B, the number Nel_b of memory cells having a threshold voltage lower than the second end read voltage Vel_b is greater than the third program reference on-cell number NP3_on (i.e., YES in operation S220), and therefore, the second start read voltage Vsl_b and the second end read voltage Vel_b are shifted to the left by the shift voltage Vsft in operation S320.

A third search region set by shifting the second start read voltage Vsl_b and the second end read voltage Vel_b to the left by the shift voltage Vsft is illustrated in FIG. 15C. Referring to FIG. 15C, the third search region is defined by a third start read voltage Vsl_c and the third end read voltage Vel_c.

Whether a number Nel_c of memory cells having a threshold voltage lower than the third end read voltage Vel_c is equal to or less than the third program reference on-cell number NP3_on is determined in operation S220. In the embodiment illustrated in FIG. 15C, the number Nel_c of memory cells having a threshold voltage lower than the third end read voltage Vel_c is less than the third program reference on-cell number NP3_on (i.e., NO in operation S220), and therefore, the third search region defined by the third start read voltage Vsl_c and the third end read voltage Vel_c is determined to belong to the reference region. Accordingly, operation S400 illustrated in FIG. 10 is performed.

An optimal read voltage may be searched for using the third start read voltage Vsl_c and the third end read voltage Vel_c which belong to the reference region in operation S400. The search region between the third start read voltage Vsl_c and the third end read voltage Vel_c may be divided into at least two ranges, memory cells belonging to each range may be counted, and the optimal read voltage may be found using the count value in operation S400. In the embodiments illustrated in FIGS. 15C and 15D, the search region between the third start read voltage Vsl_c and the third end read voltage Vel_c is divided into three ranges, i.e., first through third ranges R1, R2, and R3 and memory cells in each range R1, R2, or R3 are counted, but the disclosure is not restricted to these embodiments.

The number of memory cells in the first range R1 refers to the number of memory cells having a threshold voltage between the third start read voltage Vsl_c and "third start read voltage Vsl_c+shift voltage Vsft". The number of memory cells in the second range R2 refers to the number of memory cells having a threshold voltage between "third start read voltage Vsl_c+shift voltage Vsft" and "third start read voltage Vsl_c+2*shift voltage Vsft". The number of memory cells in the third range R3 refers to the number of memory cells having a threshold voltage between "third start read voltage Vsl_c+2*shift voltage Vsft" and the third end read voltage Vel_c.

In other words, the first through third ranges R1, R2, and R3 may be defined by dividing the search region between the third start read voltage Vsl_c and the third end read voltage Vel_c by three, but the disclosure is not restricted to the current embodiments and various modifications can be made to these embodiments. An optimal read voltage may be searched for using a result of counting memory cells in each of the first through third ranges R1, R2, and R3.

It is assumed that the results of counting memory cells in the first through third ranges R1, R2, and R3 are first through third range cell counts NR1, NR2, and NR3. When the second range cell count NR2 corresponding to the central range among the first through third ranges R1, R2, and R3 is not less than both the first range cell count NR1 and the third range cell count NR3, that is, when the second range cell count NR2 is not the minimum among the first through third range cell counts NR1, NR2, and NR3; the first through third ranges R1, R2, and R3 may be shifted to the left by the shift voltage Vsft.

Figure 15D:
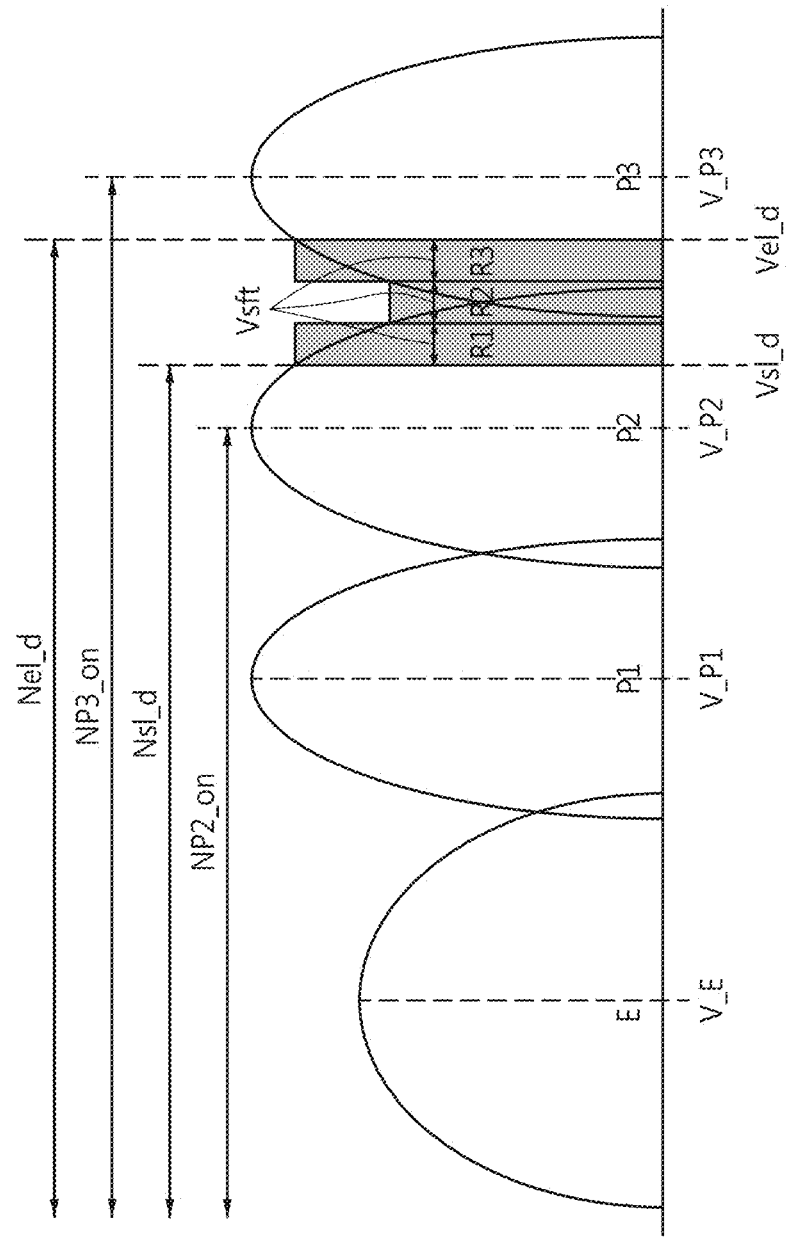

A result of shifting the first through third ranges R1, R2, and R3 to the left by the shift voltage Vsft is shown in FIG. 15D. The numbers NR1, NR2, and NR3 of memory cells in the new ranges R1, R2, and R3, respectively, are counted and it is checked whether the second range cell count NR2 is the minimum among the first through third range cell counts NR1, NR2, and NR3. The second range cell count NR2 is less than both of the first and third range cell counts NR1 and NR3 in the embodiments illustrated in FIG. 15D, and therefore, a read voltage (i.e., fourth start read voltage Vsl_d+shift voltage Vsft) at this time may be set as an optimal read voltage.

FIGS. 15C and 15D show only an example of searching for an optimal read voltage based on a search region and the disclosure is not restricted to this example. In an exemplary embodiment, a search region may be divided into at least two ranges, the number of memory cells belonging to each of the ranges is counted, and an operation may be performed on count results corresponding to the respective ranges to calculate an optimal read voltage; or an optimal read voltage may be calculated using a predetermined algorithm.

Although FIGS. 15A through 15D show only an example of a procedure for searching for an optimal read voltage for distinguishing the second programmed state P2 from the third programmed state P3, a procedure for searching for an optimal read voltage for distinguishing the erased state E from the first programmed state P1 and a procedure for searching for an optimal read voltage for distinguishing the first programmed state P1 from the second programmed state P2 may also be similar to that illustrated in FIGS. 15A through 15D.

FIGS. 16A through 16D are diagrams for explaining the method illustrated in FIGS. 10 and 11 according to exemplary embodiments of the disclosure. FIGS. 16A through 16D are provided to described the method illustrated in FIGS. 10 and 11 in detail.

Referring to FIGS. 10 and 11 and FIGS. 16A through 16D, a fifth search region is set. The fifth search region is defined by a fifth start read voltage Vsl_g and a fifth end read voltage Vel_g in operation S100. In order to determine whether the fifth search region belongs to a reference region, whether a number Nsl_g of memory cells having a threshold voltage lower than the fifth start read voltage Vsl_g is greater than the first reference memory cell number, i.e., the second program reference on-cell number NP2_on is determined in operation S210.

Figure 16B:
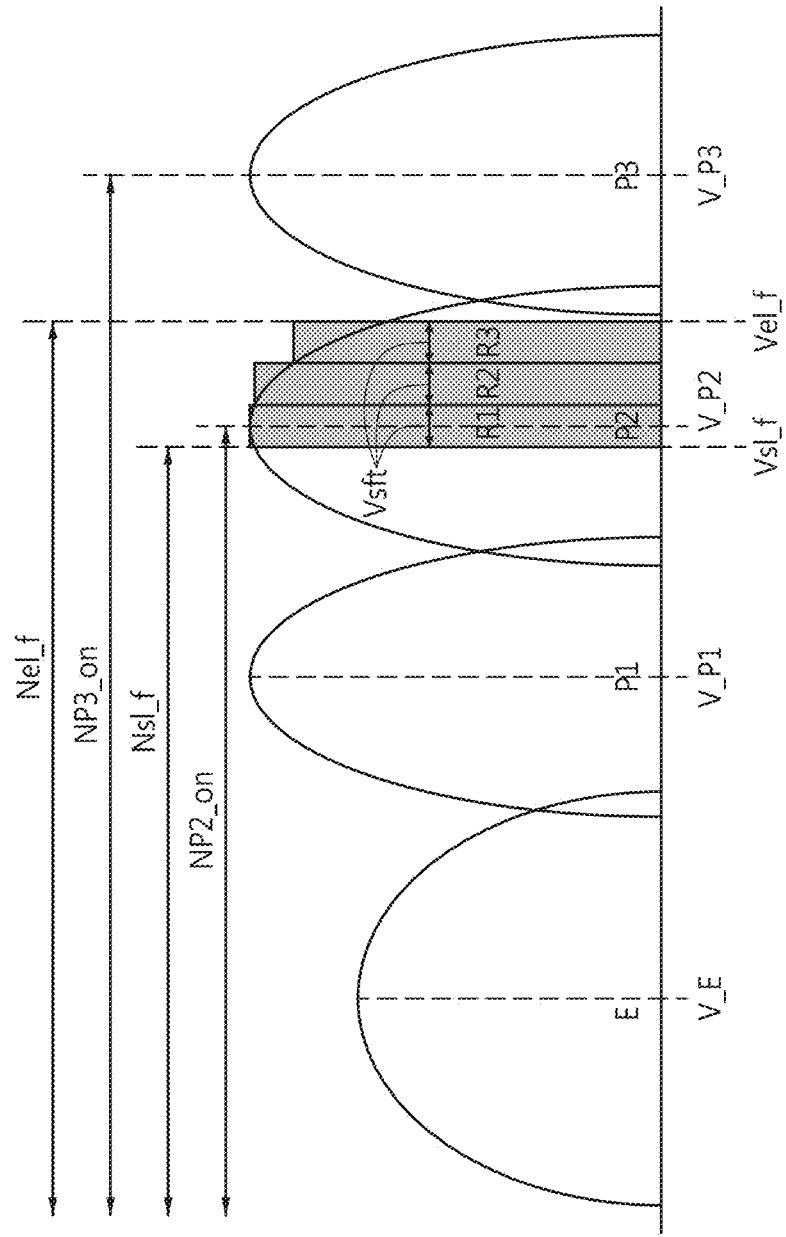

In the embodiment illustrated in FIG. 16A, since the number Nsl_g of memory cells having a threshold voltage lower than the fifth start read voltage Vsl_g is less than the second program reference on-cell number NP2_on (i.e., YES in operation S210), the fifth start read voltage Vsl_g and the fifth end read voltage Vel_g are shifted to the right by the shift voltage Vsft in operation S310. A sixth search region set by shifting the fifth start read voltage Vsl_g and the fifth end read voltage Vel_g to the right by the shift voltage Vsft is shown in FIG. 16B.

Referring to FIG. 16B, the sixth search region is defined by a sixth start read voltage Vsl_f and a sixth end read voltage Vel_f. Whether a number Nsl_f of memory cells having a threshold voltage lower than the sixth start read voltage Vsl_f is greater than the second program reference on-cell number NP2_on is determined in operation S210.

In the embodiment illustrated in FIG. 16B, since the number Nsl_f of memory cells having a threshold voltage lower than the sixth start read voltage Vsl_f is still less than the second program reference on-cell number NP2_on (i.e., YES in operation S210), the sixth start read voltage Vsl_f and the sixth end read voltage Vel_f are shifted to the right by the shift voltage Vsft in operation S310. A seventh search region set by shifting the sixth start read voltage Vsl_f and the sixth end read voltage Vel_f to the right by the shift voltage Vsft is shown in FIG. 16C.

Figure 16C:
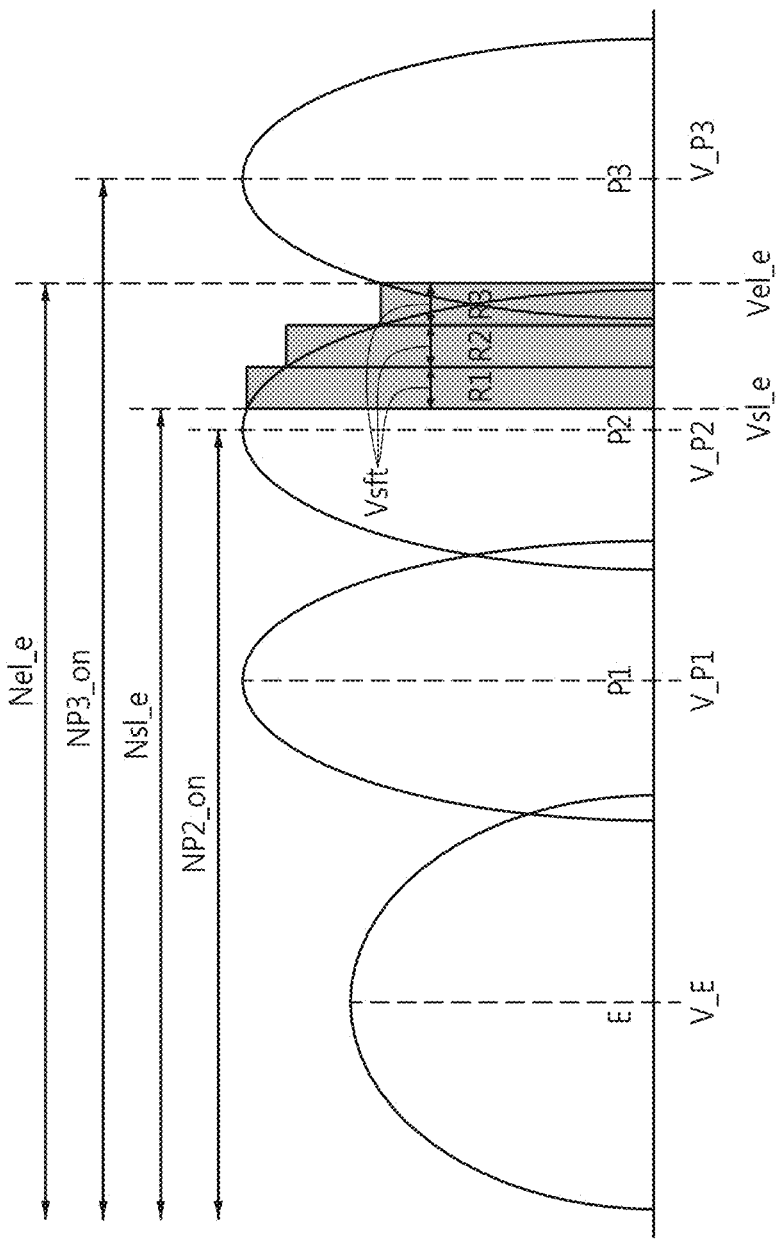

Referring to FIG. 16C, the seventh search region is defined by a seventh start read voltage Vsl_e and a seventh end read voltage Vel_e. Whether a number Nsl_e of memory cells having a threshold voltage lower than the seventh start read voltage Vsl_e is greater than the second program reference on-cell number NP2_on is determined in operation S210.

In the embodiment illustrated in FIG. 16C, since the number Nsl_e of memory cells having a threshold voltage lower than the seventh start read voltage Vsl_e is greater than the second program reference on-cell number NP2_on (i.e., NO in operation S210), whether a value Nel_e obtained by counting memory cells having a threshold voltage lower than the seventh end read voltage Vel_e is equal to or less than the second reference memory cell number, i.e., the third program reference on-cell number NP3_on is determined in operation S220.

In the embodiment illustrated in FIG. 16C, the number Nel_e of memory cells having a threshold voltage lower than the seventh end read voltage Vel_e is less than the third program reference on-cell number NP3_on (i.e., NO in operation S220), and therefore, the seventh search region defined by the seventh start read voltage Vsl_e and the seventh end read voltage Vel_e is determined to belong to the reference region. Accordingly, operation S400 illustrated in FIG. 10 is performed.

Figure 16D:
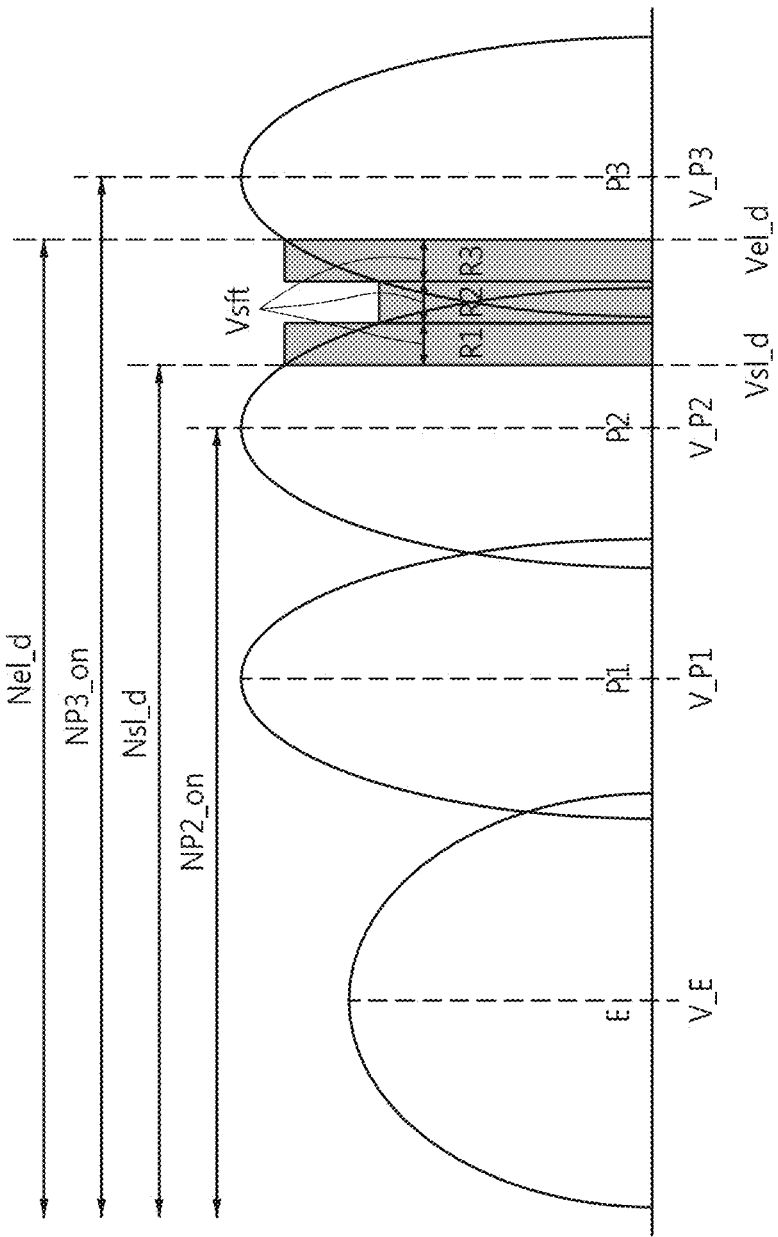

In the embodiments illustrated in FIGS. 16C and 16D, the search region between the seventh start read voltage Vsl_e and the seventh end read voltage Vel_e is divided into three ranges, i.e., first through third ranges R1, R2, and R3 and memory cells in each range R1, R2, or R3 are counted, but the disclosure is not restricted to these embodiments.

When it is assumed that the results of counting memory cells in the first through third ranges R1, R2, and R3 are the first through third range cell counts NR1, NR2, and NR3 and when the second range cell count NR2 corresponding to the central range among the first through third ranges R1, R2, and R3 is not less than both the first range cell count NR1 and the third range cell count NR3, that is, when the second range cell count NR2 is not the minimum among the first through third range cell counts NR1, NR2, and NR3; the first through third ranges R1, R2, and R3 may be shifted to the right by the shift voltage Vsft.

A result of shifting the first through third ranges R1, R2, and R3 to the right by the shift voltage Vsft is shown in FIG. 16D. The numbers NR1, NR2, and NR3 of memory cells in the new ranges R1, R2, and R3, respectively, are counted and it is checked whether the second range cell count NR2 is the minimum among the first through third range cell counts NR1, NR2, and NR3. The second range cell count NR2 is less than both of the first and third range cell counts NR1 and NR3 in the embodiment illustrated in FIG. 16D, and therefore, a read voltage (i.e., fourth start read voltage Vsl_d+shift voltage Vsft) at this time may be set as an optimal read voltage.

Although FIGS. 16A through 16D show only an example of a procedure for searching for an optimal read voltage for distinguishing the second programmed state P2 from the third programmed state P3, a procedure for searching for an optimal read voltage for distinguishing the erased state E from the first programmed state P1 and a procedure for searching for an optimal read voltage for distinguishing the first programmed state P1 from the second programmed state P2 may also be similar to that illustrated in FIGS. 16A through 16D.

Figure 16E:
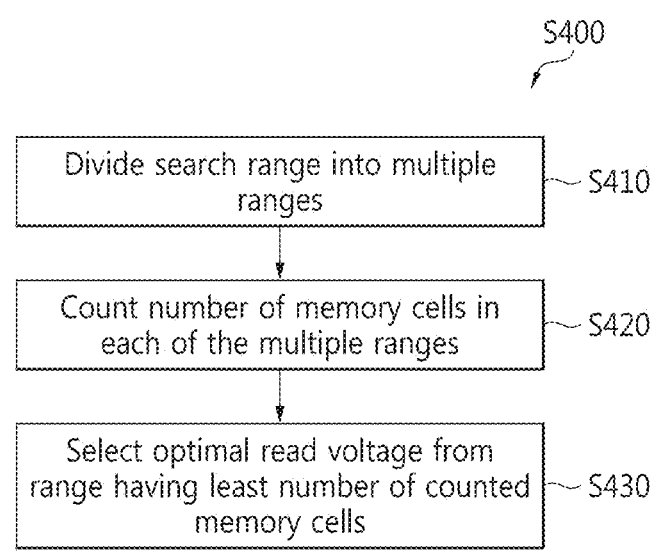
FIG. 16E illustrates an embodiment of the operation of searching for a new read voltage, illustrated in FIG. 10, in greater detail

FIG. 16E illustrates an embodiment of the operation of searching for a new read voltage, illustrated in FIG. 10, in greater detail. An optimal read voltage may be searched for using the seventh start read voltage Vsl_e and the seventh end read voltage Vel_e which belong to the reference region in operation S400. As described above, the search region between the seventh start read voltage Vsl_e and the seventh end read voltage Vel_e may be divided into at least two ranges, as illustrated in operation S410. Memory cells belonging to each range may be counted, as illustrated in operation S420. And the optimal read voltage is selected from a voltage in the range having the least number of counted memory cells, as illustrated in operation S430.

Figure 17:
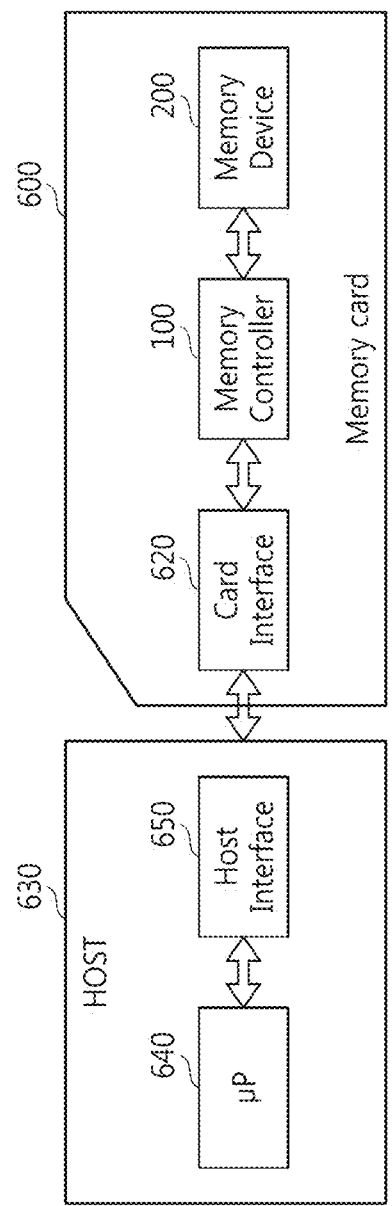
FIG. 17 is a block diagram of an electronic system including the non-volatile memory system according to an exemplary embodiment of the disclosure.

FIG. 17 is a block diagram of an electronic system 600 including the non-volatile memory system according to an exemplary embodiment of the disclosure. The electronic system 600 may be implemented as a memory card or a smart card. The electronic system 600 includes the non-volatile memory device 200, a memory controller 100, and a card interface 620.

The memory controller 100 may control data exchange between the non-volatile memory device 200 and the card interface 620. The card interface 620 may be a secure digital (SD) card interface or a multi-media card (MMC) interface, but the disclosure is not restricted to the current embodiment.

The card interface 620 may interface a host 630 and the memory controller 100 for data exchange according to a protocol of the host 630. The card interface 620 may support a universal serial bus (USB) protocol and an interchip (IC)-USB protocol. Here, the card interface 620 may indicate hardware supporting a protocol used by the host 630, software installed in the hardware, or a signal transmission mode.

When the electronic system 600 is connected with the host 630 such as a PC, a tablet PC, a digital camera, a digital audio player, a cellular phone, a console video game hardware, or a digital set-top box, a host interface 650 of the host 630 may perform data communication with the non-volatile memory device 200 through the card interface 620 and the memory controller 100 according to the control of a microprocessor 640.

Figure 18:
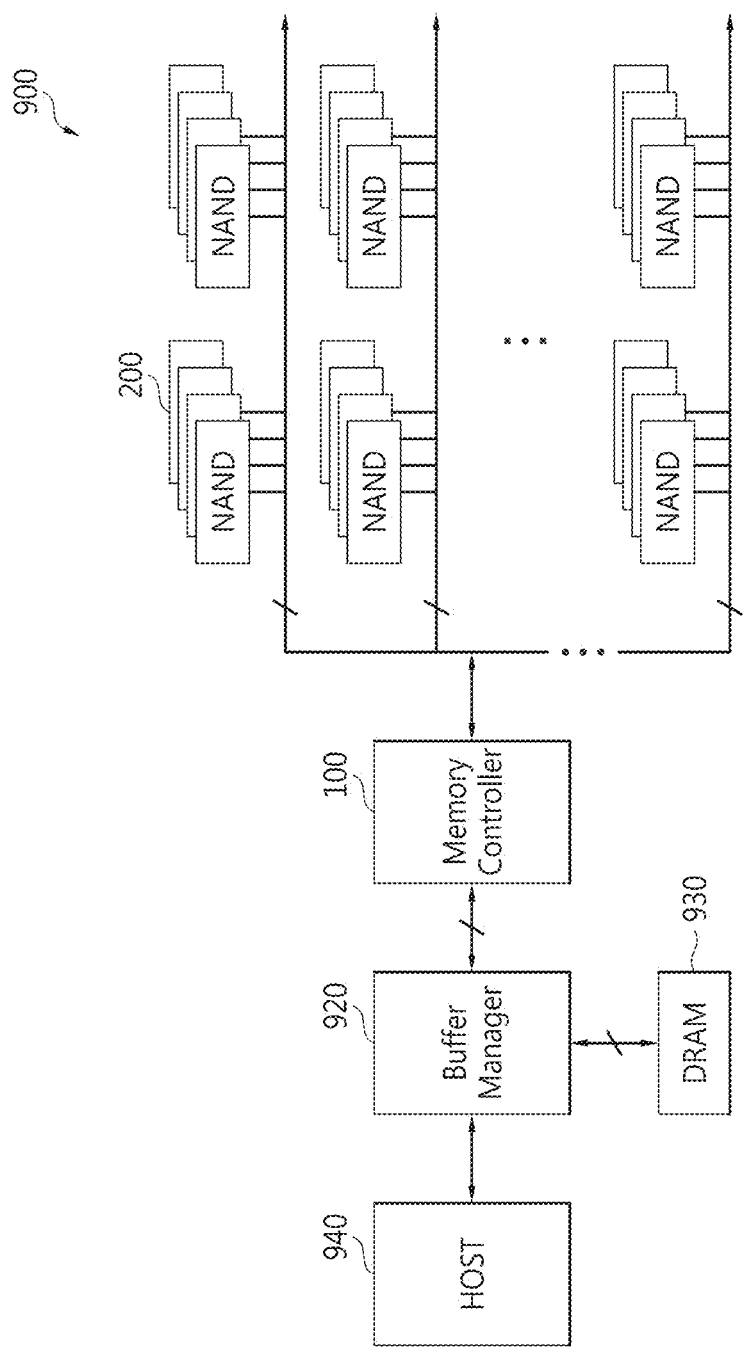
FIG. 18 is a block diagram of an electronic system including the non-volatile memory system according to an exemplary embodiment of the disclosure.

FIG. 18 is a block diagram of an electronic system 900 including the non-volatile memory system according to an exemplary embodiment of the disclosure. The electronic system 900 may be implemented as a data storage system like a solid state drive (SSD).

The electronic system 900 includes a plurality of non-volatile memory devices 200, a memory controller 100 controlling the data processing operations of the non-volatile memory devices 200, a volatile memory device 930 like a dynamic random access memory (DRAM), and a buffer manager 920 controlling data transferred between the memory controller 100 and a host 940 to be stored in the volatile memory device 930.

Figure 19:
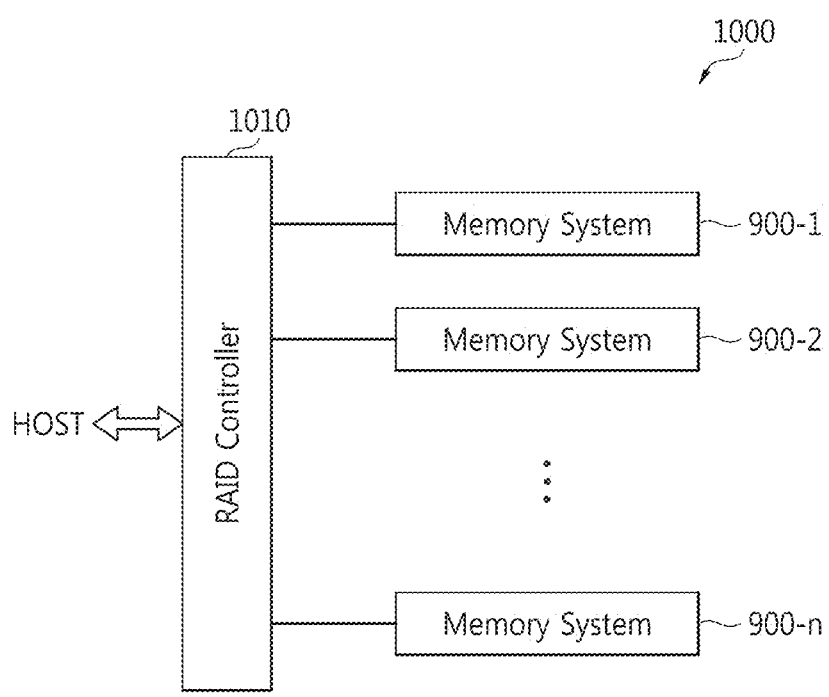
FIG. 19 is a block diagram of a data processing system including the non-volatile memory system according to an exemplary embodiment of the disclosure.

FIG. 19 is a block diagram of a data processing system 1000 including the non-volatile memory system according to an exemplary embodiment of the disclosure. Referring to FIG. 19, the data processing system 1000 may be implemented as a redundant array of independent disks (RAID) system. The data processing system 1000 includes a RAID controller 1010 and a plurality of memory systems 900-1 through 900-n where "n" is a natural number.

Each of the memory systems 900-1 through 900-n may be the memory system 900 illustrated in FIG. 18. The memory systems 900-1 through 900-n may form a RAID array. The data processing system 1000 may be a PC or an SSD.

During a program operation, the RAID controller 1010 may transmit program data output from a host to at least one of the memory systems 900-1 through 900-n according to a RAID level in response to a program command received from the host. During a read operation, the RAID controller 1010 may transmit to the host data read from at least one of the memory systems 900-1 through 900-n in response to a read command received from the host.

The present general disclosure can also be embodied as computer-readable codes on a non-transitory computer-readable medium. The computer-readable recording medium is any data storage device that can store data as a program which can be thereafter read by a computer system. Examples of the computer-readable recording medium include read-only memory (ROM), random-access memory (RAM), CD-ROMs, magnetic tapes, floppy disks, and optical data storage devices.

The computer-readable recording medium can also be distributed over network coupled computer systems so that the computer-readable code is stored and executed in a distributed fashion. Also, functional programs, codes, and code segments to accomplish the present general disclosure can be easily construed by programmers.

As described above, according to an exemplary embodiment of the disclosure, whether a search region for finding an optimal read voltage is appropriately set is determined before a new read voltage (e.g., the optimal read voltage) for a non-volatile memory device is searched for and the search region is adjusted according to the determination result, so that a correct read voltage can be found. As a result, data errors occurring due to an inappropriate read voltage are reduced, and therefore, the integrity of read data is enhanced.

While the disclosure has been particularly shown and described with reference to exemplary embodiment thereof, it will be understood by those of ordinary skill in the art that various changes in forms and details may be made therein without departing from the spirit and scope of the disclosure as defined by the following claims.

What is claimed is:

1. A method of operating a non-volatile memory device, the method comprising:
   setting a search region defined by a start read voltage and an end read voltage;
   determining whether the search region belongs to a reference region;
   changing the search region when it is determined that the search region does not belong to the reference region; and
   searching for a new read voltage based on the search region when it is determined that the search region belongs to the reference region.

2. The method of claim 1, wherein the determining whether the search region belongs to the reference region comprises:
   counting a number of first memory cells having a threshold voltage lower than the start read voltage and comparing the number of first memory cells with a number of first reference memory cells; and
   counting a number of second memory cells having a threshold voltage lower than the end read voltage and comparing the number of second memory cells with a number of second reference memory cells.

3. The method of claim 2, wherein the changing the search region comprises:
   increasing the start read voltage and the end read voltage by a first shift voltage when the number of first memory cells is not greater than the number of first reference memory cells; and
   decreasing the start read voltage and the end read voltage by a second shift voltage when the number of second memory cells is greater than the number of second reference memory cells.

4. The method of claim 3, wherein the number of first memory cells and the number of second reference memory cells are calculated and stored in advance.

5. The method of claim 3, wherein the number of first reference memory cells is a number of memory cells having a threshold voltage lower than a first reference threshold voltage; the number of second reference memory cells is a number of memory cells having a threshold voltage lower than a second reference threshold voltage; and the first and second reference threshold voltages are threshold voltages that have maximum numbers of memory cells in adjacent threshold voltage distributions, respectively.

6. The method of claim 1, wherein the determining whether the search region belongs to the reference region comprises:
   counting a number of first memory cells having a threshold voltage higher than the start read voltage and comparing the number of first memory cells with a number of first reference memory cells; and
   counting a number of second memory cells having a threshold voltage higher than the end read voltage and comparing the number of second memory cells with a number of second reference memory cells.

7. The method of claim 6, wherein the changing the search region comprises:
   increasing the start read voltage and the end read voltage by a first shift voltage when the number of first memory cells is greater than the number of first reference memory cells; and
   decreasing the start read voltage and the end read voltage by a second shift voltage when the number of second memory cells is not greater than the number of second reference memory cells.

8. The method of claim 7, wherein the number of first memory cells and the number of second reference memory cells are calculated and stored in advance.

9. The method of claim 7, wherein the number of first reference memory cells is a number of memory cells having a threshold voltage higher than a first reference threshold voltage; the number of second reference memory cells is a number of memory cells having a threshold voltage higher than a second reference threshold voltage; and the first and second reference threshold voltages are threshold voltages that have maximum numbers of memory cells in adjacent threshold voltage distributions, respectively.

10. The method of claim 1, wherein the searching for the new read voltage comprises:
    dividing a region between the start read voltage and the end read voltage into at least two ranges and counting a number of memory cells in each of the ranges when it is determined that the search region belongs to the reference region; and searching for the new read voltage using a result of counting the number of memory cells in each of the ranges.

11. The method of claim 10, wherein the counting the number of memory cells in each of the ranges comprises:
counting a number of memory cells having a threshold voltage belonging to a first threshold voltage range that has the start read voltage as a start point to obtain a first range cell count;
counting a number of memory cells having a threshold voltage belonging to a second threshold voltage range that has the end read voltage as an end point to obtain a second range cell count; and
searching for an optimal read voltage using the first range cell count and the second range cell count.

12. The method of claim 1, wherein the non-volatile memory device comprises a three-dimensional memory cell array, the three-dimensional memory cell array comprises first memory cells connected to a first word line and second memory cells which are connected to a second word line and positioned above the first memory cells, and the search region or the searching for the new read voltage is different between the first word line and the second word line.

13. A method of operating a non-volatile memory device, the method comprising:
comparing a first start read voltage with a first reference threshold voltage;
comparing a first end read voltage with a second reference threshold voltage;
changing the first start read voltage and the first end read voltage based on both comparison results to generate a second start read voltage and a second end read voltage; and
searching for a new read voltage based on the second start read voltage and the second end read voltage that have been changed.

14. The method of claim 13, wherein the changing the first start read voltage and the first end read voltage comprises:
increasing the first start read voltage and the first end read voltage by a first shift voltage when the first start read voltage is not greater than the first reference threshold voltage; and
decreasing the first start read voltage and the first end read voltage by a second shift voltage when the first end read voltage is greater than the second reference threshold voltage.

15. The method of claim 13, wherein the comparing the first start read voltage with the first reference threshold voltage comprises:
counting a number of first memory cells having a threshold voltage lower than the first start read voltage; and
comparing the number of first memory cells with a number of first reference memory cells,
wherein the number of first reference memory cells is a number of memory cells having a threshold voltage lower than the first reference threshold voltage and is calculated without actual counting.

16. The method of claim 15, wherein the comparing the first end read voltage with the second reference threshold voltage comprises:
counting a number of second memory cells having a threshold voltage lower than the first end read voltage; and
comparing the number of second memory cells with a number of second reference memory cells,
wherein the number of second reference memory cells is a number of memory cells having a threshold voltage lower than the second reference threshold voltage and is calculated without actual counting.

17. The method of claim 15, wherein the comparing the first start read voltage with the first reference threshold voltage further comprises comparing the number of first memory cells with a number of third reference memory cells when a difference between the number of first memory cells and the number of first reference memory cells is greater than a threshold value.

18. The method of claim 13, wherein the comparing the first start read voltage with the first reference threshold voltage comprises:
counting a number of first memory cells having a threshold voltage higher than the first start read voltage; and
comparing the number of first memory cells with a number of first reference memory cells,
wherein the number of first reference memory cells is a number of memory cells having a threshold voltage higher than the first reference threshold voltage and is calculated without actual counting.

19. The method of claim 18, wherein the comparing the first end read voltage with the second reference threshold voltage comprises:
counting a number of second memory cells having a threshold voltage higher than the first end read voltage; and
comparing the number of second memory cells with a number of second reference memory cells,
wherein the number of second reference memory cells is a number of memory cells having a threshold voltage higher than the second reference threshold voltage and is calculated without actual counting.

20. The method of claim 18, wherein the first shift voltage changes according to a difference between the number of first memory cells and the number of first reference memory cells.

* * * * *